(12) United States Patent
Sun et al.

(10) Patent No.: US 12,211,672 B2
(45) Date of Patent: *Jan. 28, 2025

(54) APPARATUS AND METHOD FOR PLASMA ETCHING

(71) Applicant: Samsung Electronics Co., Ltd., Suwon-si (KR)

(72) Inventors: Jongwoo Sun, Hwaseong-si (KR); Kyohyeok Kim, Seoul (KR); Taehwa Kim, Hwaseong-si (KR); Haejoong Park, Yongin-si (KR); Jewoo Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/632,060

(22) Filed: Apr. 10, 2024

(65) Prior Publication Data

US 2024/0258084 A1    Aug. 1, 2024

Related U.S. Application Data

(63) Continuation of application No. 17/543,794, filed on Dec. 7, 2021, now Pat. No. 11,984,304.

(30) Foreign Application Priority Data

Apr. 12, 2021   (KR) .................. 10-2021-0046956

(51) Int. Cl.
*H01J 37/32*   (2006.01)

(52) U.S. Cl.
CPC . *H01J 37/32724* (2013.01); *H01J 2237/2001* (2013.01); *H01J 2237/334* (2013.01)

(58) Field of Classification Search
CPC ......... H01J 37/32724; H01J 2237/2001; H01J 2237/334; H01J 2237/3343;
(Continued)

(56) References Cited

U.S. PATENT DOCUMENTS 9,396,960 B2    7/2016   Ogawa et al.
9,437,402 B2    9/2016   Kikuchi et al.
(Continued)

FOREIGN PATENT DOCUMENTS

JP    H1140545 A    2/1999
JP    6522180 B1    5/2019
(Continued)

OTHER PUBLICATIONS

Office Action, dated Oct. 24, 2022, from the Korean Intellectual Property Office for corresponding application KR 10-2021-0046956 (5 pages).
(Continued)

*Primary Examiner* — Rudy Zervigon
(74) *Attorney, Agent, or Firm* — Muir Patent Law, PLLC

(57) ABSTRACT

An apparatus for plasma etching having an electrostatic chuck including a base layer, a bonding layer, an adsorption layer including a plurality of protrusions on the bonding layer and contacting a lower surface of a substrate, and an edge ring spaced apart from and surrounding a lateral surface of the substrate; a plurality of coolant suppliers injecting a coolant between the plurality of protrusions; a plurality of pipes supplying the coolant to the plurality of coolant suppliers to circulate the coolant in a predetermined direction; a cooling device in which the plasma etching process includes first and second operations, wherein the coolant is injected to cause the electrostatic chuck to reach a first temperature during the first operation, and reach a second temperature during the second operation; and a
(Continued)

controller controlling a valve connected to the plurality of pipes to determine a circulation direction of the coolant.

11 Claims, 21 Drawing Sheets

(58) Field of Classification Search
CPC ........... H01J 37/32642; H01J 2237/002; H01J 2237/3341; H01L 21/67069; H01L 21/3065; H01L 21/6831; C23C 14/50
USPC ............... 118/728, 663, 666; 156/345.51; 279/128; 269/1
See application file for complete search history.

(56) References Cited

U.S. PATENT DOCUMENTS

| | | | |
|---|---|---|---|
| 10,192,774 B2 | 1/2019 | Hosaka et al. | |
| 10,818,503 B2 | 10/2020 | Lee et al. | |
| 2003/0160568 A1 | 8/2003 | Arai et al. | |
| 2005/0133164 A1 | 6/2005 | Fischer et al. | |
| 2007/0283891 A1* | 12/2007 | Okayama | H01L 21/6831 |
| | | | 118/728 |
| 2008/0308230 A1* | 12/2008 | Takahashi | H01L 21/67109 |
| | | | 156/345.52 |
| 2009/0308538 A1* | 12/2009 | Yonekura | H01L 21/67109 |
| | | | 118/728 |
| 2013/0109190 A1 | 5/2013 | Lill et al. | |
| 2014/0073066 A1* | 3/2014 | Tabuchi | H01J 37/32724 |
| | | | 438/5 |
| 2015/0024594 A1 | 1/2015 | Fischer et al. | |
| 2015/0053348 A1 | 2/2015 | Nagayama et al. | |
| 2016/0071755 A1 | 3/2016 | Park et al. | |
| 2017/0323813 A1 | 11/2017 | Silveira et al. | |
| 2018/0053674 A1 | 2/2018 | Lee et al. | |
| 2018/0211824 A1 | 7/2018 | Kudo et al. | |
| 2018/0269090 A1 | 9/2018 | Kobayashi et al. | |
| 2018/0286642 A1 | 10/2018 | Matyushkin et al. | |
| 2018/0366303 A1 | 12/2018 | Tsuda et al. | |
| 2019/0103255 A1 | 4/2019 | Chung | |
| 2019/0326139 A1 | 10/2019 | Forderhase | |
| 2019/0355597 A1 | 11/2019 | Mochizuki et al. | |
| 2020/0176230 A1 | 6/2020 | Lu et al. | |

FOREIGN PATENT DOCUMENTS

| | | |
|---|---|---|
| KR | 10-1999-0029782 A | 4/1999 |
| KR | 10-1999-0039626 A | 6/1999 |
| KR | 1020060127041 A | 12/2006 |
| KR | 1020210025983 A | 3/2012 |
| KR | 1020150009940 A | 1/2015 |
| KR | 10-2015-0077094 A | 7/2015 |
| KR | 101814554 B1 | 1/2018 |
| KR | 1020180087155 A | 8/2018 |
| KR | 1020180137408 A | 12/2018 |
| KR | 102113624 B1 | 5/2020 |

OTHER PUBLICATIONS

Notice of Allowance, dated Oct. 3, 2023, issued by the Korean Intellectual Property Office for corresponding Korean Patent Application KR 10-2021-0046956.

Office Action dated Apr. 7, 2023 issued by the Korean Intellectual Property Office for corresponding Korean Patent Application No. KR 10-2021-0046956.

* cited by examiner

APPARATUS AND METHOD FOR PLASMA ETCHING

CROSS-REFERENCE TO RELATED APPLICATION(S)

This application is a continuation of U.S. patent application Ser. No. 17/543,794, filed Dec. 7, 2021, which claims benefit of priority under 35 U.S.C. § 119 to Korean Patent Application No. 10-2021-0046956, filed Apr. 12, 2021, in the Korean Intellectual Property Office, the disclosures of all of which are incorporated herein by reference in their entireties.

BACKGROUND

The present inventive concept relates to an apparatus for plasma etching and a method for plasma etching.

An etching process may be a process of removing a thin film in a remaining region, other than a region in which a photoresist is formed by a photolithography process. Recently, plasma may be used in an etching process of a substrate, among semiconductor processes. Plasma etching may be performed by applying a high energy to gaseous molecules in a vacuum to ionize or decompose and activate the molecules, and by colliding the activated molecules with a thin film to break a crystal structure of the thin film, to remove the thin film. In the meantime, the plasma etching may have disadvantages in that an etching rate thereof is relatively low and selectivity thereof is relatively poor, compared to other etching methods. In this regard, recently, a method of performing an etching process in a low temperature state to improve an etching rate thereof has been proposed. However, this method has a limitation in that it may cause a problem of deteriorating selectivity for a substrate.

SUMMARY

An aspect of the present inventive concept is to provide an apparatus for plasma etching and a method for plasma etching, capable of adjusting and applying a process temperature according to an etching operation to improve selectivity for a semiconductor substrate while maintaining an etching rate, and furthermore, uniformly controlling depths of recesses in the semiconductor substrate and increasing critical dimensions of a lower hole.

According to an aspect of the present inventive concept, an apparatus for plasma etching includes an electrostatic chuck disposed in a chamber in which a plasma etching process is performed, and includes a base layer, a bonding layer disposed on the base layer, an adsorption layer including a plurality of protrusions disposed on the bonding layer and contacting a lower surface of a substrate to be subjected to the plasma etching process, and an edge ring disposed on the base layer to be spaced apart from a lateral surface of the substrate and to surround the lateral surface of the substrate; a plurality of coolant suppliers passing through the base layer and injecting a coolant controlling a process temperature of the substrate between the plurality of protrusions; a plurality of pipes connected to the plurality of coolant suppliers and supplying the coolant to the plurality of coolant suppliers to circulate the coolant in a predetermined direction; a cooling device configured to inject the coolant into the electrostatic chuck through the plurality of pipes and the plurality of coolant suppliers to control a temperature of the electrostatic chuck; and a controller configured to control a valve connected to the plurality of pipes to determine a circulation direction of the coolant, wherein the plasma etching process includes a first operation and a second operation after the first operation, and wherein the coolant is injected to cause the electrostatic chuck to reach a first temperature between about −40° C. and −5° C. during the first operation, and the coolant is injected to cause the electrostatic chuck to reach a second temperature between about 30° C. and 90° C. during the second operation.

According to an aspect of the present inventive concept, an apparatus for plasma etching includes an electrostatic chuck disposed in a chamber in which a plasma etching process is performed, and includes a base layer, a bonding layer disposed on the base layer, an adsorption layer disposed on a substrate to be subjected to the plasma etching process, and includes a plurality of protrusions disposed on the bonding layer and contacting a lower surface of the substrate, an edge ring disposed on the base layer to be spaced apart from a lateral surface of the substrate and to surround the lateral surface of the substrate, and a ring bonding layer disposed between the edge ring and the base layer; and a cooling device configured to inject a coolant into the electrostatic chuck to control a temperature of the electrostatic chuck, wherein the coolant is injected into the electrostatic chuck to cause the electrostatic chuck to reach a first temperature between about −40° C. and −5° C. during a first period of time of the plasma etching process, and the coolant is injected into the electrostatic chuck to cause the electrostatic chuck to reach a second temperature between about 30° C. and 90° C. during a second period of time after the first period of time, and wherein the ring bonding layer is formed of the same material as the base layer.

According to an aspect of the present inventive concept, an apparatus for plasma etching includes an electrostatic chuck disposed in a chamber in which a plasma etching process is performed, and including a base layer, a bonding layer disposed on the base layer, an adsorption layer disposed on the bonding layer and in which a semiconductor device to be subjected to the plasma etching process is disposed; and a cooling device configured to inject a coolant into the electrostatic chuck to control a temperature of the electrostatic chuck, wherein the coolant is injected into the electrostatic chuck to cause the electrostatic chuck to reach a first temperature between about −40° C. and −5° C. during a main etching operation in which etching of a molded layer disposed on a semiconductor substrate is performed in the semiconductor device, and the coolant is injected into the electrostatic chuck to cause the electrostatic chuck to reach a second temperature between about 30° C. and 90° C. during an over etching operation of forming a recess in the semiconductor substrate.

According to an aspect of the present inventive concept, a method for plasma etching includes injecting a coolant causing an electrostatic chuck to reach a first temperature between about −40° C. and −5° C. into the electrostatic chuck on which a substrate to be subjected to a plasma etching process is disposed; etching a molded layer included in the substrate as a main etching operation; injecting the coolant causing the electrostatic chuck to reach a second temperature between about 30° C. and 90° C. into the electrostatic chuck; and forming a recess in a lower substrate disposed below the molded layer as an over etching operation.

According to an aspect of the present inventive concept, a method for plasma etching includes injecting a coolant circulating in a first direction into an electrostatic chuck on which a substrate to be subjected to a plasma etching process is disposed; etching a molded layer included in the substrate as a main etching operation; injecting the coolant circulating in a second direction, different from the first direction, into the electrostatic chuck; and forming a recess in a lower substrate disposed below the molded layer as an over etching operation.

According to an aspect of the present inventive concept, a method for plasma etching includes generating an algorithm determining a circulation direction of a coolant to control a process temperature of a substrate to be subjected to a plasma etching process; etching a molded layer included in the substrate as a main etching operation; applying the generated algorithm to convert the circulation direction of the coolant; and forming a recess in a lower substrate disposed below the molded layer as an over etching operation.

BRIEF DESCRIPTION OF DRAWINGS

The above and other aspects, features, and advantages of the present inventive concept will be more clearly understood from the following detailed description, taken in conjunction with the accompanying drawings, in which like numerals refer to like elements throughout. In the drawings.

DETAILED DESCRIPTION

Figure 1:
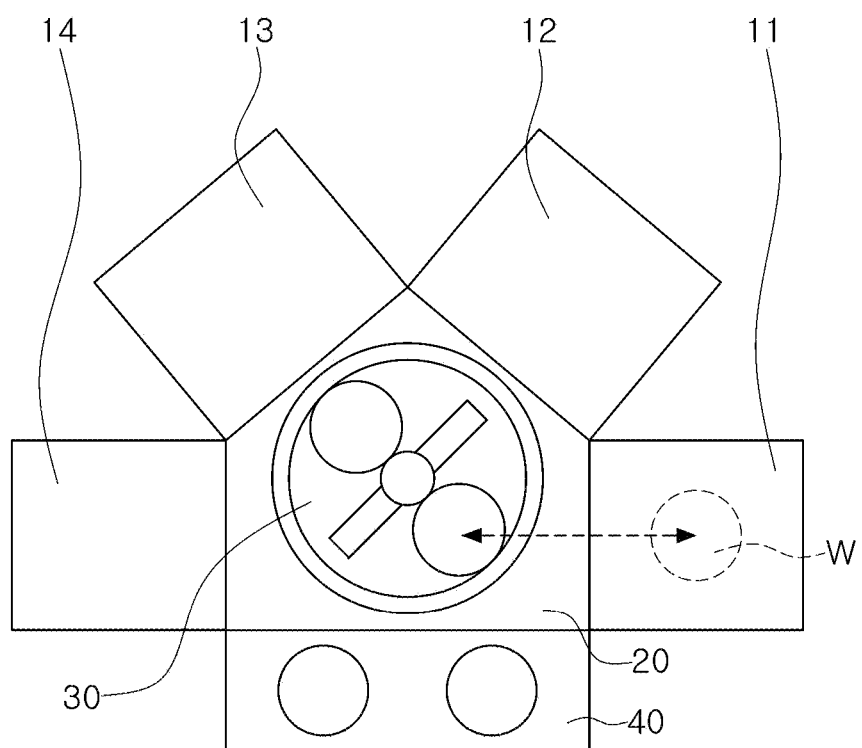
FIG. 1 is a schematic configuration diagram of semiconductor processing equipment including an apparatus for plasma etching, according to an example embodiment of the present inventive concept.

Hereinafter, preferred embodiments of the present inventive concept will be described with reference to the accompanying drawings.

In the drawings and the specification, terms such as "first," "second," and "third" may be used to describe various components, but the components are not limited by the terms. The terms such as "first," "second," and "third" may be used for the purpose of distinguishing one component from another. For example, without departing from the scope of the present inventive concept, a "first component" may be referred to as a "second component."

FIG. 1 is a schematic configuration diagram of semiconductor processing equipment including an apparatus for plasma etching, according to an example embodiment of the present inventive concept.

Referring to FIG. 1, semiconductor processing equipment 1 including an apparatus for plasma etching according to an embodiment of the present inventive concept may include a plurality of processing chambers 11 to 14 for performing a semiconductor process with respect to a substrate W. For example, the plurality of processing chambers 11 to 14 may include a deposition processing chamber for performing a deposition process, a polishing processing chamber for performing a chemical mechanical polishing (CMP) process, an etching processing chamber for removing at least a portion of device layers included in the substrate W by generating plasma including radicals and ions of a source gas or using an etchant or the like, or the like. The plurality of processing chambers 11 to 14 may include an inspection processing chamber for inspecting the substrate W while a process is in progress or after the process is completed.

For example, the substrate W may be a semiconductor substrate on which the semiconductor process is performed, or a wafer formed of a semiconductor material such as silicon or the like. Semiconductor devices on the substrate W by semiconductor processes to be performed in the plurality of processing chambers 11 to 14, wiring patterns connected to the semiconductor devices, and insulating layers covering the semiconductor devices and the wiring patterns, or the like may be formed, and a plurality of semiconductor chips may be produced from the substrate W.

For example, the plurality of processing chambers 11 to 14 may receive the substrate W by a transfer chamber 20 and a load-lock chamber 40 to perform the semiconductor process. The transfer chamber 20 and the load-lock chamber 40 may include a transfer robot 30, and the transfer robot 30 may transfer the substrate W or the like, which may be a process target. For example, the transfer robot 30 of the transfer chamber 20 may remove a process target such as the substrate W or the like from the load-lock chamber 40, and transfer the same to the plurality of processing chambers 11 to 14, or may transfer the process target between the processing chambers 11 to 14. In an embodiment, the transfer robot may be a handler.

The transfer robot 30 may include a chuck for fixing the process target and a linear stage for transferring the process target. For example, the chuck may be an electrostatic chuck (ESC) for fixing the process target using electrostatic force. A plurality of protrusions contacting the process target may be formed on the electrostatic chuck.

Referring to FIG. 1, in the semiconductor processing equipment 1 including the apparatus for plasma etching according to an embodiment of the present inventive concept, the transfer robot 30 of the transfer chamber 20 may remove the substrate W from the load-lock chamber 40 and may transfer the same to the transfer chamber 20, and may transfer the substrate W as a process target to the processing chamber 11. In some embodiments, a process target is not limited to a wafer. For example, the substrate W may be various substrates other than a wafer, for example, a mother substrate for a display.

At least one of the processing chambers 11 to 14 may be allocated as a chamber for performing an etching process. In an embodiment, the processing chamber 11 may be a plasma processing chamber for removing a portion of a thin film formed on an upper surface of the substrate W using plasma. For example, equipment for plasma etching including a plasma processing chamber may be defined as an apparatus for plasma etching.

Figure 2:
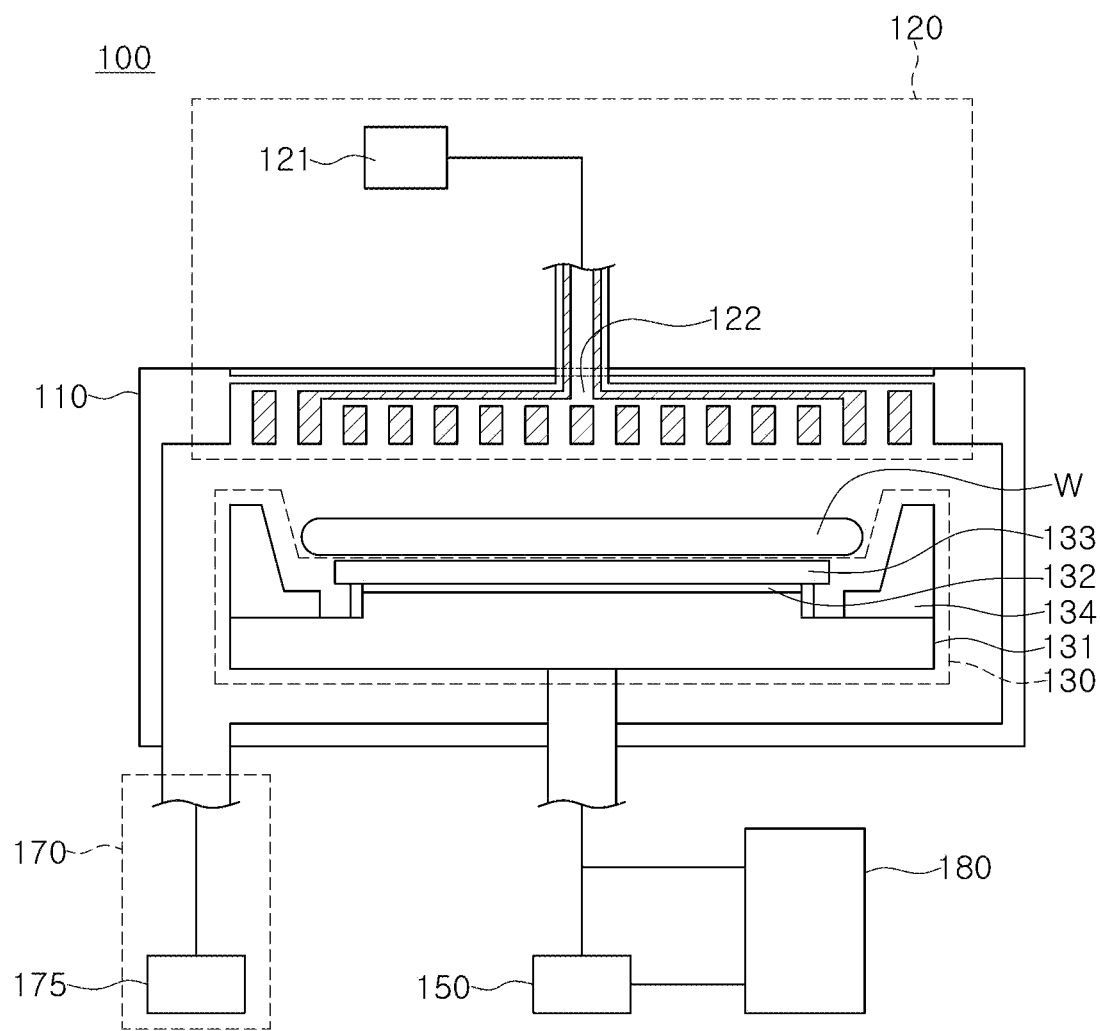
FIG. 2 is a view schematically illustrating an apparatus for plasma etching, according to an example embodiment of the present inventive concept.

FIG. 2 is a view schematically illustrating an apparatus for plasma etching, according to an example embodiment of the present inventive concept.

Referring to FIG. 2, an apparatus for plasma etching 100 according to an embodiment of the present inventive concept may include a chamber 110, an etching gas supply unit 120, an electrostatic chuck 130, a cooling device 150, an exhaust system 170, and a controller 180.

The etching gas supply unit 120 may include a gas supplier 121 and a gas injector 122. The gas supplier 121 may supply an etching gas for plasma etching to the gas injector 122. For example, the etching gas may include $O_2$, $Cl_2$, $SF_6$, or the like. The gas injector 122 may inject the supplied etching gas onto an upper surface of a substrate W disposed in the chamber 110. Although not illustrated in FIG. 2, the etching gas supply unit 120 may further include a power supply for supplying power for generating plasma.

The electrostatic chuck 130 may be disposed in the chamber 110 in which a plasma etching process is performed, and the substrate W may be fixed to an upper surface of the electrostatic chuck 130 using static electricity. For example, the electrostatic chuck 130 may include a base layer 131, a bonding layer 132, and an adsorption layer 133.

The base layer 131, the bonding layer 132, and the adsorption layer 133 may be sequentially stacked. For example, the base layer 131 may be a plate made of aluminum (Al) or the like. The bonding layer 132 may couple the base layer 131 and the adsorption layer 133 to each other. The adsorption layer 133 may fix the substrate W on an upper surface thereof, and may be formed of ceramic or the like.

In an embodiment, the electrostatic chuck 130 may further include an edge ring 134 disposed on the base layer 131. The edge ring 134 may be disposed to be spaced apart from a lateral surface of the substrate W and surround the lateral surface of the substrate W. The edge ring 134 may be used to adjust a temperature in an edge region of the substrate W, when a temperature of the substrate W increases by heat generated during a plasma etching process.

The cooling device 150 may supply a coolant to a lower portion of the substrate W through a pipe. For example, the coolant may be a cooling gas such as helium (He) or the like. When the temperature of the substrate W increases by the heat generated during the plasma etching process, layers including a photoresist or the like, formed on the substrate W, may be denatured. The coolant may prevent the temperature of the substrate W from rising during the plasma etching process. This is only illustrative, and a role of the cooling device 150 is not limited thereto. In the apparatus 100 according to an embodiment of the present inventive concept, the cooling device 150 may decrease or increase the temperature of the substrate W according to a process operation.

The exhaust system 170 may include an exhaust unit 175 for discharging gas in the chamber 110 externally to perform a plasma etching process. For example, the exhaust unit 175 may be a vacuum pump.

In the apparatus 100 according to an embodiment of the present inventive concept, the controller 180 may be connected to the cooling device 150 and/or a pipe between the cooling device 150 and the electrostatic chuck 130. For example, the controller 180 may adjust a temperature of the coolant supplied from the cooling device 150 according to a process operation. Also, the controller 180 may control a circulation direction and a movement path of the coolant under various conditions.

FIGS. 3A to 3E are views illustrating example etching processes by a general apparatus for plasma etching.

Figure 3A:
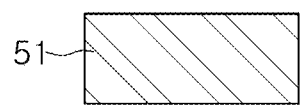
FIGS. 3A to 3E are views illustrating etching processes by a general apparatus for plasma etching.
Figure 3B:
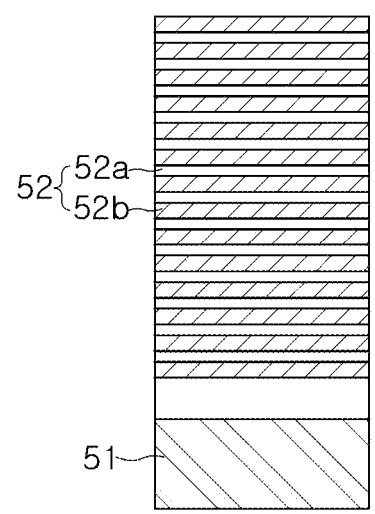
Figure 3C:
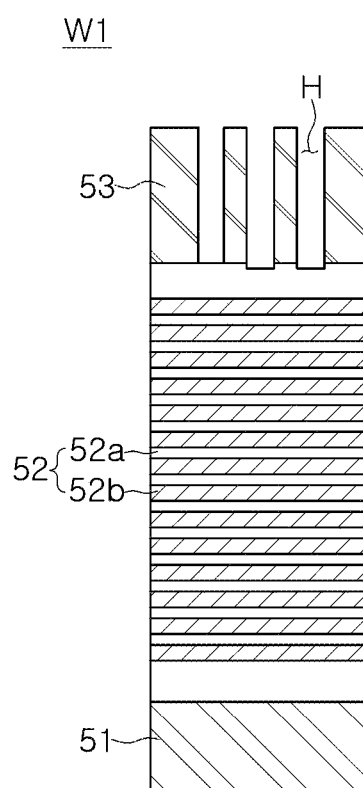
Figure 3D:
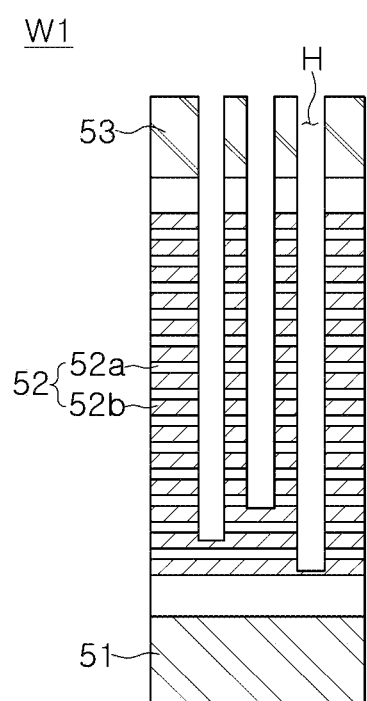
Figure 3E:
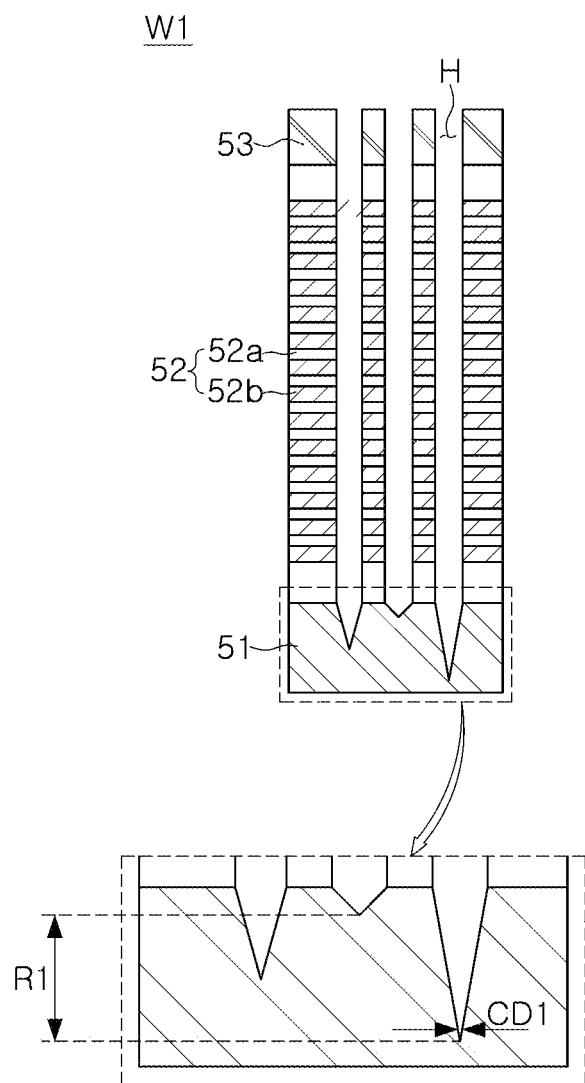

FIGS. 3A and 3B are views illustrating a deposition process of forming a semiconductor device, and FIGS. 3C to 3E are views illustrating an etching process of forming a channel in the semiconductor device. For example, processes illustrated in FIGS. 3A and 3B and processes illustrated in FIGS. 3C to 3E may be performed in different chambers. This is only illustrative, and embodiments are not limited thereto.

Referring to FIGS. 3A and 3B, a semiconductor device may be formed by alternately stacking sacrificial layers 52a, replaced with gate electrodes, and interlayer insulating layers 52b on a semiconductor substrate 51. For example, the semiconductor device may be defined as a substrate W1, and the semiconductor substrate 51 may be defined as a lower substrate 51, and the sacrificial layers 52a and the interlayer insulating layers 52b, alternately stacked, may be defined as a molded layer 52.

The lower substrate 51 may be made of silicon, and the sacrificial layers 52a may be formed of a material that may be etched with etch selectivity with respect to the interlayer insulating layers 52b. For example, the interlayer insulating layers 52b may be formed of at least one of silicon oxide or silicon nitride, and the sacrificial layers 52a may be made of a material selected from silicon, silicon oxide, silicon carbide, and silicon nitride, different from the interlayer insulating layers 52b.

Since the sacrificial layers 52a of the semiconductor device may be replaced with gate electrodes, degrees of integration of elements formed in the semiconductor device may be improved by increasing the stack number of the sacrificial layers 52a. For example, in a memory semiconductor device such as a flash memory or the like, the stack number of the sacrificial layers 52a and the interlayer insulating layers 52b included in the molded layer 52 may directly affect capacity of a memory and a size of a memory chip.

Referring to FIGS. 3C to 3E, a plasma etching process may be performed on the substrate W1 in which a mask layer 53 is formed. For example, the substrate W1 may have a structure in which the lower substrate 51, the molded layer 52, and the mask layer 53 are stacked.

The mask layer 53 may be formed of a carbon-containing material layer such as an amorphous carbon layer (ACL) or a spin-on hardmask (SOH). This is only illustrative, and embodiments are not limited thereto. For example, the substrate W1 may further include other components in addition to the lower substrate 51, the molded layer 52, and the mask layer 53, and each of the components may be made of various materials.

Referring to FIG. 3C, in the plasma etching process, an initial etching process may be performed on the substrate W1 in which the mask layer 53 is formed. In the initial etching process, plasma ions may form a plurality of holes H passing through the mask layer 53. For example, the plurality of holes H, illustrated in FIG. 3C, may be a component for forming a channel of the semiconductor device. The channel may be formed to have a smaller size, compared to other components requiring etching, such as a device isolation layer or the like. Therefore, the plurality of holes H for forming the channel may have a relatively narrow width, compared to other holes that may be formed by the etching process. For example, a width of each of the plurality of holes H may be defined as a critical dimension.

Referring to FIG. 3D, an apparatus for plasma etching may complete the initial etching process for the mask layer 53, and may then etch the molded layer 52. The operation of etching the molded layer 52 may be defined as a main etching operation.

The main etching operation of the plasma etching process may be performed as a low temperature process to improve an etching rate. For example, the main etching operation may be performed at a process temperature of about −40° C. to −20° C. using a cooling device included in the apparatus for plasma etching. When the low temperature process is applied, a reaction of etching gas to an etching target may increase to improve the etching rate.

As described above, in the main etching operation, the plurality of holes H may be formed to have a narrow width at a high etching rate. Therefore, critical dimensions of the plurality of holes H may be different from each other, and thus a difference in etch depth may occur between the plurality of holes H. As the stack number of the molded layers 52 increases for integration of the semiconductor device, a height the molded layers 52 tends to increase. Therefore, a difference in etch depth between the plurality of holes H may increase, after the main etching operation is completed.

Referring to FIG. 3E, after the apparatus for plasma etching completes the main etching operation of the molded layer 52, the lower substrate 51 may be etched to form a recess in the lower substrate 51. The etching operation of forming the recess with respect to the lower substrate 51 may be defined as an over etching operation.

In general, the over etching operation may be performed as a low temperature process, like the main etching operation. In the over etching operation, improvement of an etching rate in the low temperature process may be problematic. For example, in the low temperature process, etching gas may have low selectivity with respect to the lower substrate 51. Therefore, the difference in etch depth caused by the difference in critical dimension, in the molded layer 52, may be transferred to the lower substrate 51 as it is. Recesses having non-uniform depths may be formed in the lower substrate 51.

In a semiconductor memory device such as a flash memory or the like, another configuration may be disposed below the substrate W1. For example, in a flash NAND memory device having a cell-on-peri (COP) structure, a peripheral circuit region may be disposed below the substrate W1 on which a memory cell region is formed. The peripheral circuit region may include a plurality of wirings included in the peripheral circuit. The recesses having non-uniform depths formed in the lower substrate 51 may affect an operation of the configuration disposed below the substrate W1. For example, when at least a portion of the plurality of holes H pass through the lower substrate 51 due to a difference in etch depth in the molded layer 52, a semiconductor device produced by a semiconductor process may have defects such as a problem in operation or the like.

For example, in the over etching operation of forming the recess in the lower substrate 51, a difference in depth of recesses between the plurality of holes H may have a first value R1. For example, the first value R1 may be a maximum difference in the depths of the recesses between the plurality of holes H. In addition, since a degree of etching in a horizontal direction may be insufficient, the plurality of holes H may be formed to have a sharp shape, respectively. For example, in a recess region of the lower substrate 51, a difference between an upper critical dimension and a critical dimension of lower part of the recess may become large, and in this case, the critical dimension of lower part of the recess may be a first critical dimension CD1.

Figure 4:
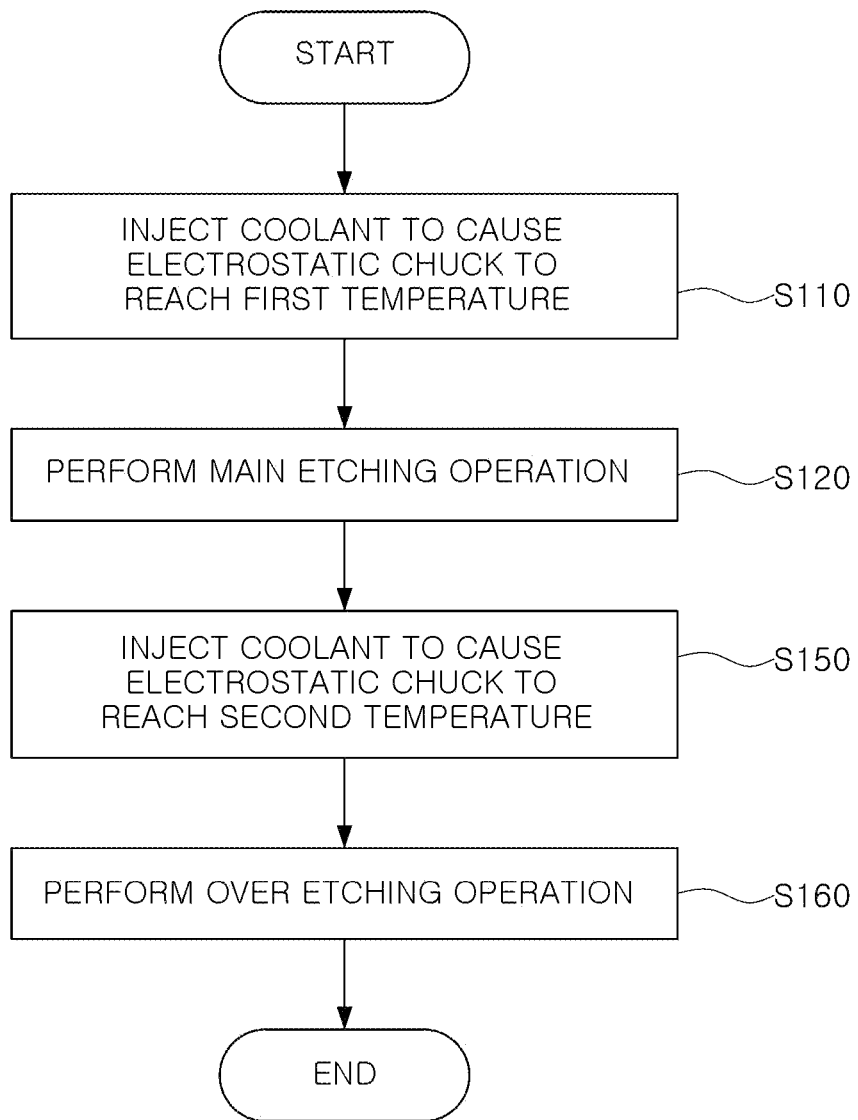
FIG. 4 is a flowchart illustrating operations of an apparatus for plasma etching, according to an example embodiment of the present inventive concept.

FIG. 4 is a flowchart illustrating operations of an apparatus for plasma etching, according to an example embodiment of the present inventive concept.

Referring to FIG. 4, an apparatus for plasma etching according to an embodiment of the present inventive concept may perform a main etching operation and an over etching operation below different process temperatures in order to solve the above-described problems.

Before proceeding with a main etching operation, for example, when an initial etching operation is in progress or after the initial etching operation is completed, the apparatus for plasma etching may inject a coolant into an electrostatic chuck disposed in a chamber in which a plasma etching process is performed, causing the electrostatic chuck to reach a first temperature (S110). The coolant may lower a temperature of a substrate raised by the plasma etching process, to the first temperature. The present inventive concept is not limited thereto, and the temperature of the substrate may be higher than the first temperature. The temperature of the substrate may be defined as a process temperature in a plasma etching process.

When a temperature of the substrate reaches or approaches the first temperature by S110, a main etching operation of forming a plurality of holes in a molded layer included in the substrate may be performed (S120). From the main etching operation, the plurality of holes H having different depths may be formed in the substrate, as illustrated in FIG. 3D.

When the main etching operation is finished, the apparatus for plasma etching according to an embodiment of the present inventive concept may inject a coolant into the electrostatic chuck, causing the electrostatic chuck to reach a second temperature, higher than the first temperature (S150). The coolant may lower a temperature of the substrate raised by the plasma etching process, to the second temperature. This is only illustrative, and embodiments are not limited thereto. For example, when a temperature of the substrate is lower than the second temperature, after the main etching operation is completed by S110, the temperature of the substrate may increase to the second temperature. Also, the temperature of the substrate may be higher or lower than the second temperature.

When a temperature of the substrate reaches or approaches the second temperature by S150, an over etching operation of forming a recess in the substrate, particularly a lower substrate, may be performed (S160). Since the second temperature, a process temperature at which the over etching operation is performed, may be higher than the first temperature, the apparatus for plasma etching according to the present inventive concept may reduce a reaction between the etching gas and the lower substrate in the over etching operation. Therefore, in the apparatus for plasma etching according to an embodiment of the present inventive concept, a configuration for changing the process temperature according to the plasma etching process may perform a role similar to that of an etch-stopping layer, between the molded layer and the lower substrate.

Figure 5A:
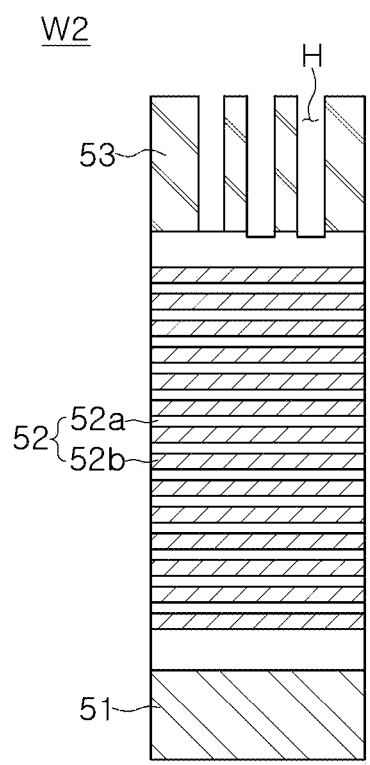
FIGS. 5A to 5C are views illustrating etching processes by an apparatus for plasma etching, according to an example embodiment of the present inventive concept.
Figure 5B:
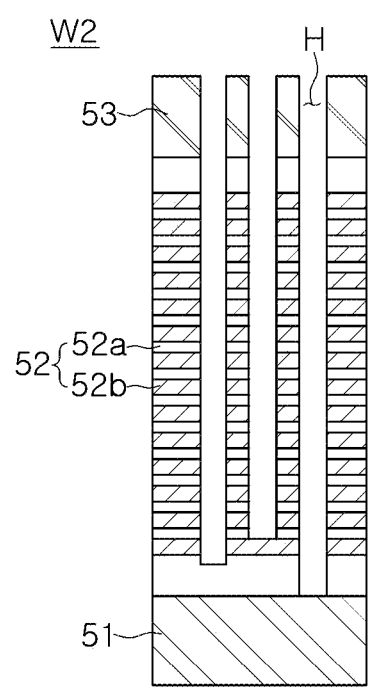
Figure 5C:
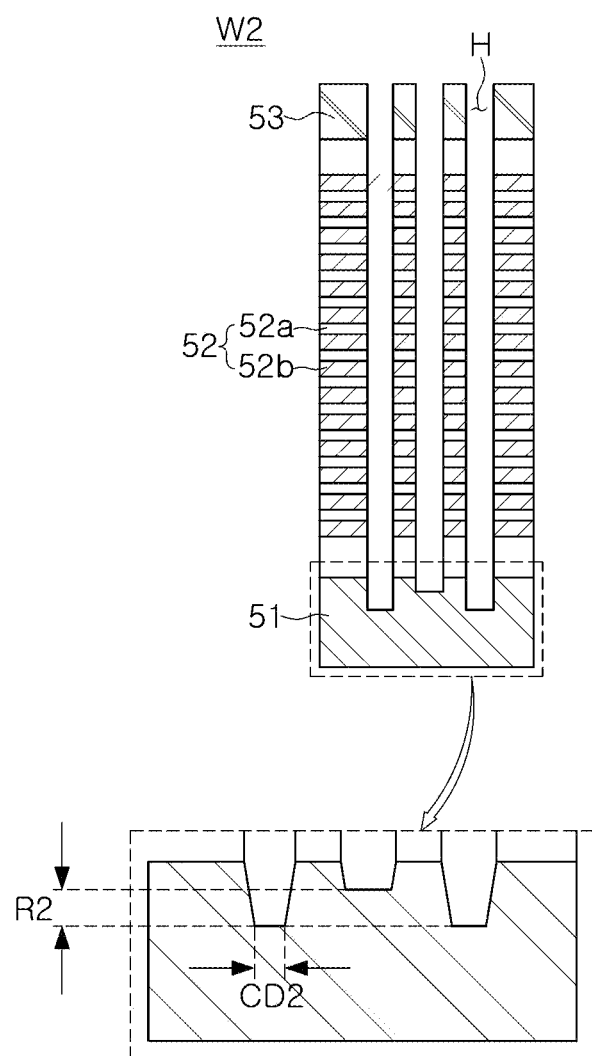

FIGS. 5A to 5C are views illustrating etching processes by an apparatus for plasma etching, according to an example embodiment of the present inventive concept.

A plasma etching process performed using an apparatus for plasma etching according to an embodiment of the present inventive concept, illustrated in FIGS. 5A to 5C, may correspond to the plasma etching process illustrated in FIGS. 3C to 3E.

As described with reference to FIGS. 3C to 3E, a plasma etching process may be performed on a substrate W2 on which a mask layer 53 is formed. For example, a substrate W2 may have a structure in which a lower substrate 51, a molded layer 52, and a mask layer 53 are stacked, and the substrate W2 may have the same structure as the substrate W1 described with reference to FIG. 3C. The substrate W2, illustrated in FIG. 5A, may be formed by the same process as the deposition process described with reference to FIGS. 3A and 3B.

Referring to FIGS. 5A and 5B, a main etching operation of etching the molded layer 52 may be performed in the same manner as the etching process described with reference to FIGS. 3C and 3D. For example, in a plasma etching process in which a low process temperature is applied, plasma ions may form a plurality of holes H passing through the mask layer 53 and the molded layer 52.

Referring to FIG. 5C, in the apparatus for plasma etching according to an embodiment of the present inventive concept, an over etching operation of forming a recess in the lower substrate 51 may be performed by applying a room temperature or a high process temperature.

Referring to FIG. 4 and FIG. 5C together, the low process temperature may correspond to the first temperature, and the room temperature or the high process temperature may correspond to the second temperature. For example, the first temperature may be between about −40° C. and −5° C., and the second temperature may be between about 30° C. and 90° C. For example, a cooling device included in the apparatus for plasma etching according to an embodiment of the present inventive concept may inject a coolant causing an electrostatic chuck to reach a first temperature in the main etching operation, and may inject a coolant causing an electrostatic chuck to reach a second temperature, higher than the first temperature, in the over etching operation.

In the over etching operation to which a high temperature process is applied, etching gas may have reduced reactivity with respect to an etching target, and may have a high selectivity with respect to the lower substrate 51. Therefore, a difference in etch depth caused by a difference in critical dimension in the molded layer 52 may be reduced in a process of recessing the lower substrate 51.

Recesses having relatively uniform depths may be formed in the lower substrate 51, as compared with the method for plasma etching described with reference to FIGS. 3A to 3E. For example, in the over etching operation of forming the recess in the lower substrate 51, a difference in depth of recesses between the plurality of holes H may have a second value R2. For example, the second value R2 may be a maximum difference in the depths of the recesses between the plurality of holes H, and the second value R2 may be smaller than the first value R1.

In addition, when an etching process is performed using the apparatus for plasma etching according to an embodiment of the present inventive concept, the plurality of holes H may be formed to have a blunt shape by performing the etching process in the horizontal direction together. For example, in a recess region of the lower substrate 51, a difference between an upper critical dimension and a critical dimension of lower part of the recess may be greater than the first critical dimension CD1 illustrated in FIG. 3E, wherein the critical dimension of lower part of the recess may be a second critical dimension CD2.

Figure 6:
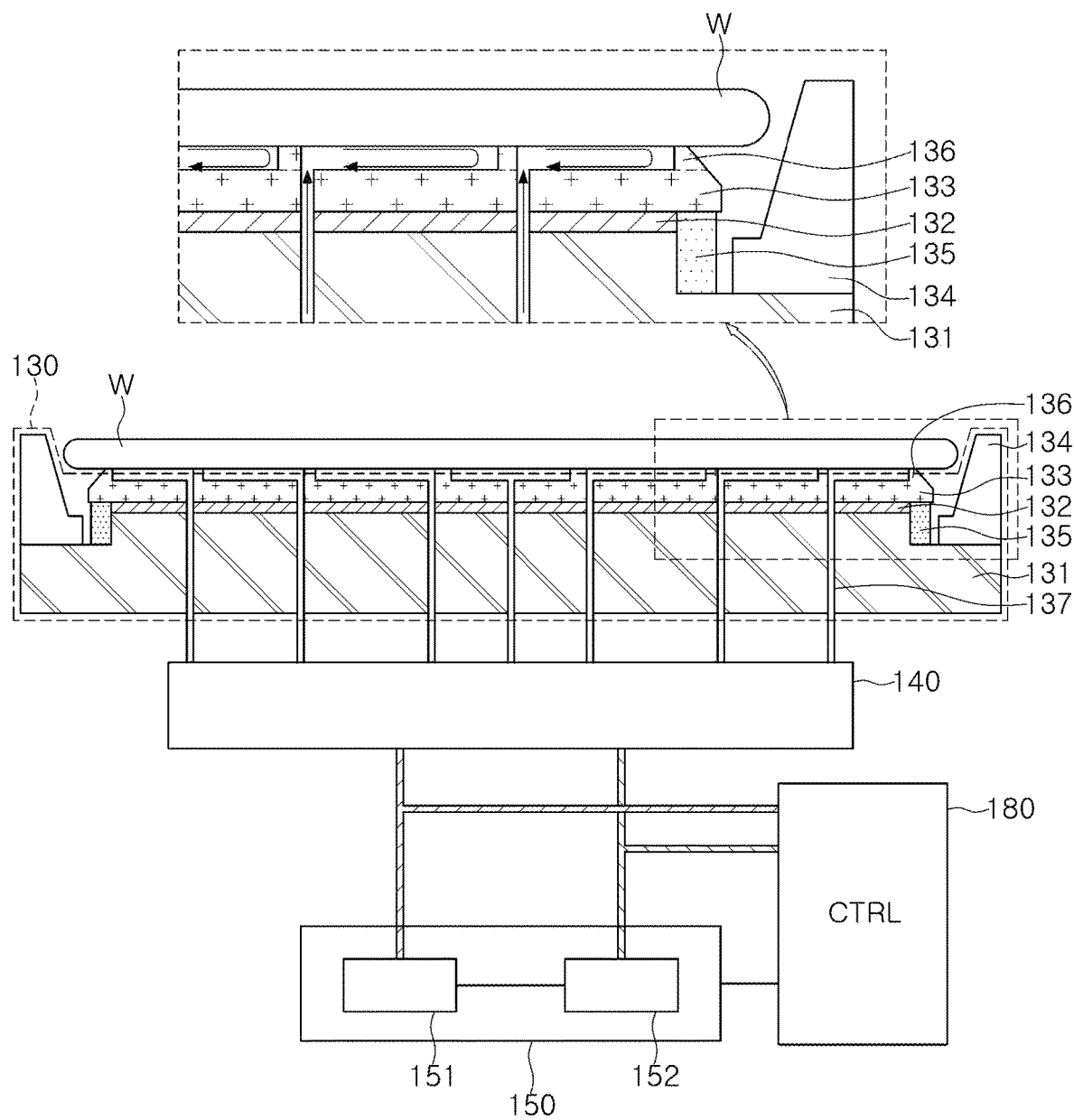
FIG. 6 is a view illustrating a main configuration of an apparatus for plasma etching, according to an example embodiment of the present inventive concept.

FIG. 6 is a view illustrating a main configuration of an apparatus for plasma etching, according to an example embodiment of the present inventive concept.

FIG. 6 may be a view illustrating the electrostatic chuck 130, the cooling device 150, and the controller (CTRL) 180 in the apparatus 100 according to an embodiment of the present inventive concept, illustrated in FIG. 2.

Referring to FIG. 6, an electrostatic chuck 130 may include a base layer 131, a bonding layer 132, and an adsorption layer 133. The electrostatic chuck 130 may further include an edge ring 134 and a heat transfer block 135 to improve cooling efficiency in an edge portion of a substrate W. The electrostatic chuck 130, illustrated in FIG. 6, may have the same configuration as the electrostatic chuck 130, illustrated in FIG. 2.

In an apparatus for plasma etching 100 according to an embodiment of the present inventive concept, the adsorption layer 133 included in the electrostatic chuck 130 may include a plurality of protrusions 136 contacting a lower surface of the substrate W. For example, at least a portion of the plurality of protrusions 136 may be a dam, serving as a side wall, for preventing cooling gas supplied from a cooling device 150 from leaking. Structures of the plurality of protrusions 136, illustrated in FIG. 6, are only illustrative, and are not limited. For example, a portion of the plurality of protrusions 136 may have a structure spaced apart from the lower surface of the substrate W.

In the apparatus 100 according to an embodiment of the present inventive concept, a plurality of spaces for separating the substrate W and the adsorption layer 133 may be formed between the plurality of protrusions 136. For example, the plurality of spaces may be connected to a plurality of coolant suppliers 137 into which a coolant is injected, and may provide a path through which the injected coolant flows.

The plurality of coolant suppliers 137 may pass through the base layer 131. In example embodiments, the plurality of coolant suppliers 137 may be channels formed to extend through the base layer 131, the bonding layer 132, and the adsorption layer 133. For example, the coolant injected into the plurality of spaces between the plurality of protrusions 136 by the plurality of coolant suppliers 137 may circulate with a predetermined direction, and the process temperature of the substrate W may be adjusted. By this, the apparatus 100 may prevent an increase in temperature of the substrate W that may occur during the plasma etching process, to improve process reliability.

A configuration of the apparatus 100 according to an embodiment of the present inventive concept is not limited to the illustrated ones. For example, a shield layer for protecting the adsorption layer 133 may be formed between the adsorption layer 133 and the plurality of spaces. In addition, the electrostatic chuck 130 may further include a storage channel extending in a direction, perpendicular to the plurality of coolant suppliers 137. For example, the storage channel may be formed in the base layer 131, and may temporarily store the cooling gas supplied from the cooling device 150.

The apparatus 100 according to an embodiment of the present inventive concept may include a plurality of pipes 140 connected to the plurality of coolant suppliers 137, to inject the coolant into the electrostatic chuck 130. For example, the plurality of pipes 140 may connect an interior and an exterior of a chamber in which a process is performed. The plurality of pipes 140 may be connected to a plurality of valves, and a circulation direction of the coolant may be changed, depending on whether the plurality of valves are closed. Therefore, the path through which the coolant is injected may be changed, depending on the circulation direction of the coolant.

The apparatus 100 may include a cooling device 150 controlling a temperature of the coolant injected into the electrostatic chuck 130 through the plurality of pipes 140 and the plurality of coolant suppliers 137, according to operations of a plasma etching process. For example, the temperature of the coolant may be adjusted to change a temperature of the electrostatic chuck 130 from a first temperature to a second temperature, higher than the first temperature. For example, a plasma etching process by an operation of the cooling device 150 may be performed by S110, S120, S150, and S160 illustrated in FIG. 4. The cooling device 150 may include a first storage device 151 and a second storage device 152. For example, the first storage device 151 may store a coolant for adjusting a temperature of the electrostatic chuck to a first temperature, and the second storage device 152 may store a coolant for adjusting a temperature of the electrostatic chuck to a second temperature. The first temperature may be between about −40° C. and −5° C., and the second temperature may be between about 30° C. and 90° C. The coolant stored in the first storage device 151 and the second storage device 152 may be the same cooling gas, for example He.

A controller 180 included in the apparatus 100 according to an embodiment of the present inventive concept may control a valve connected to the plurality of pipes 140 and the cooling device 150. For example, the controller 180 may control a locked state of the valve connected to the plurality of pipes 140 to determine a circulation direction of the coolant. In addition, the controller 180 may determine a temperature of the coolant discharged from the cooling device 150. For example, the controller 180 may control the cooling device 150 to selectively discharge the coolant stored in the first storage device 151 and the coolant stored in the second storage device 152, under various conditions.

Figure 7:
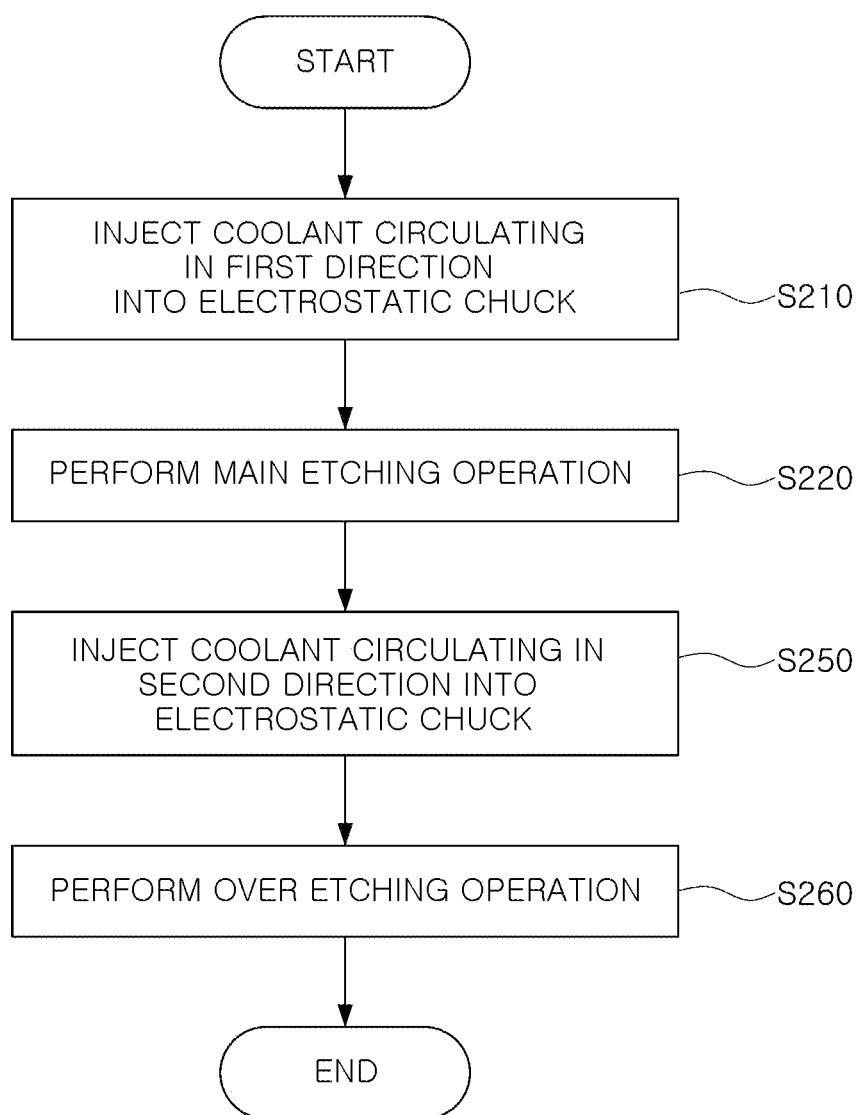
FIG. 7 is a flowchart illustrating operations of an apparatus for plasma etching, according to an example embodiment of the present inventive concept.

FIG. 7 is a flowchart illustrating operations of an apparatus for plasma etching, according to an example embodiment of the present inventive concept.

Referring to FIG. 7, an apparatus for plasma etching according to an embodiment of the present inventive concept may change a circulation direction of a coolant according to an operation of a process. A controller included in the apparatus for plasma etching may change a temperature of the coolant injected into an electrostatic chuck, together with the circulation direction of the coolant.

Before proceeding with a main etching operation, for example, when an initial etching operation is in progress or after the initial etching operation is completed, the apparatus for plasma etching may inject a coolant circulating in a first direction into an electrostatic chuck on which a substrate to be subjected to the plasma etching process is disposed (S210). For example, the first direction may be a direction in which the coolant circulates from an edge of the substrate to a center of the substrate. This is only illustrative, and embodiments are not limited thereto.

The coolant may lower a temperature of the substrate raised by a plasma etching process, to the first temperature. The present inventive concept is not limited thereto, and the temperature of the substrate may be higher than the first temperature. The injected coolant may gradually increase in temperature in a process of lowering the temperature of the substrate. Therefore, temperature distribution of the substrate may be changed, depending on a circulation direction of the coolant. For example, a coolant for adjusting the temperature of the substrate to the first temperature may be circulated in the first direction to evenly adjust the temperature distribution of the substrate, to solve a problem of heat generation in an edge portion.

When a temperature of the substrate reaches or approaches the first temperature by S210, a main etching operation of forming a plurality of holes in a molded layer included in the substrate may be performed (S220). The plurality of holes H may be formed in the substrate by the main etching operation. When the main etching operation is finished, the apparatus for plasma etching according to an embodiment of the present inventive concept may inject a coolant circulating in a second direction to the electrostatic chuck (S250). The second direction may be opposite to the first direction. For example, the second direction may be a direction in which the coolant circulates from the center of the substrate to the edge of the substrate. This is only illustrative, and embodiments are not limited thereto.

After a temperature of the substrate is adjusted using the coolant circulating in the second direction, an over etching operation of forming a recess in a lower substrate may be performed (S260). The coolant may adjust the temperature of the substrate raised by the plasma etching process, to a first temperature or a second temperature, higher than the first temperature. This is only illustrative, and embodiments are not limited thereto. When the temperature of the substrate is adjusted to the second temperature, it may actively switch between low and high temperatures while solving a heat problem by circulating the coolant in the second direction, and furthermore, it may solve a recess uniformity problem in the over etching operation.

Figure 8:
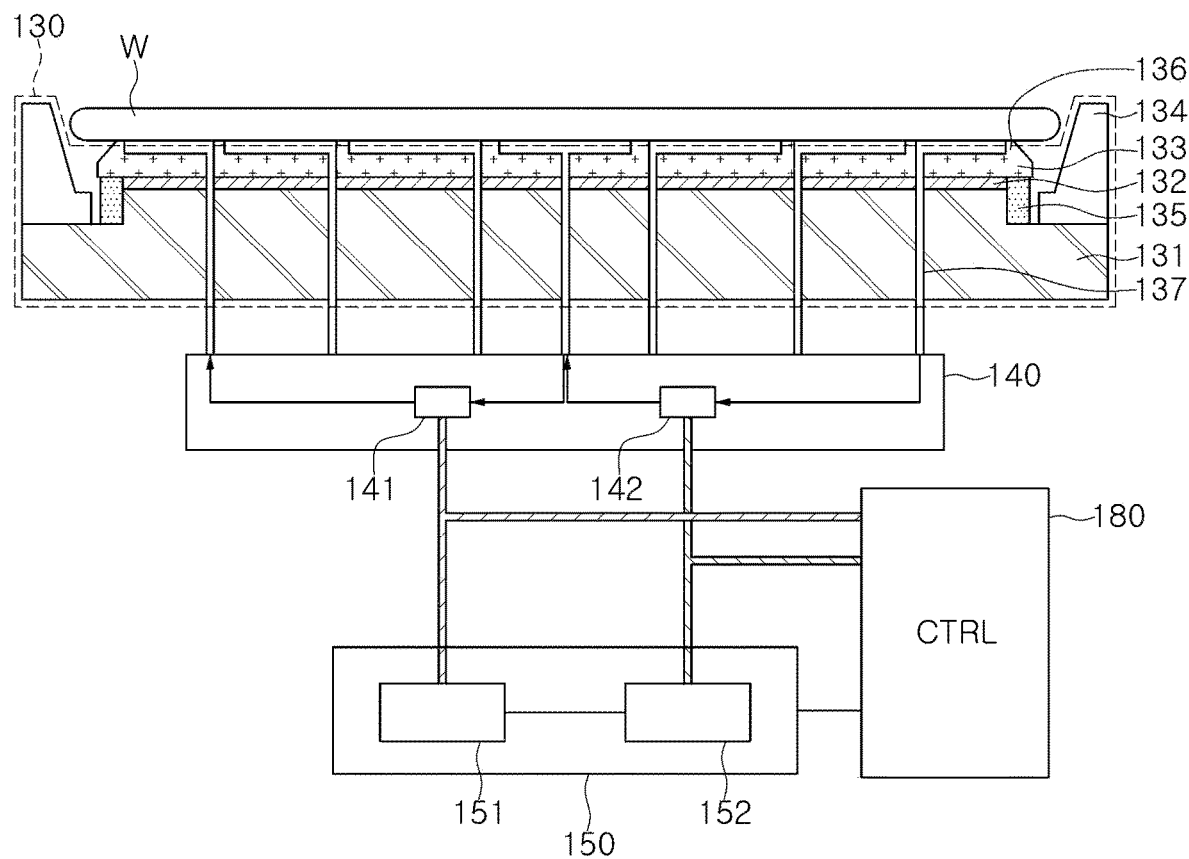
FIG. 8 is a view illustrating operations of an apparatus for plasma etching, according to an example embodiment of the present inventive concept.
Figure 9:
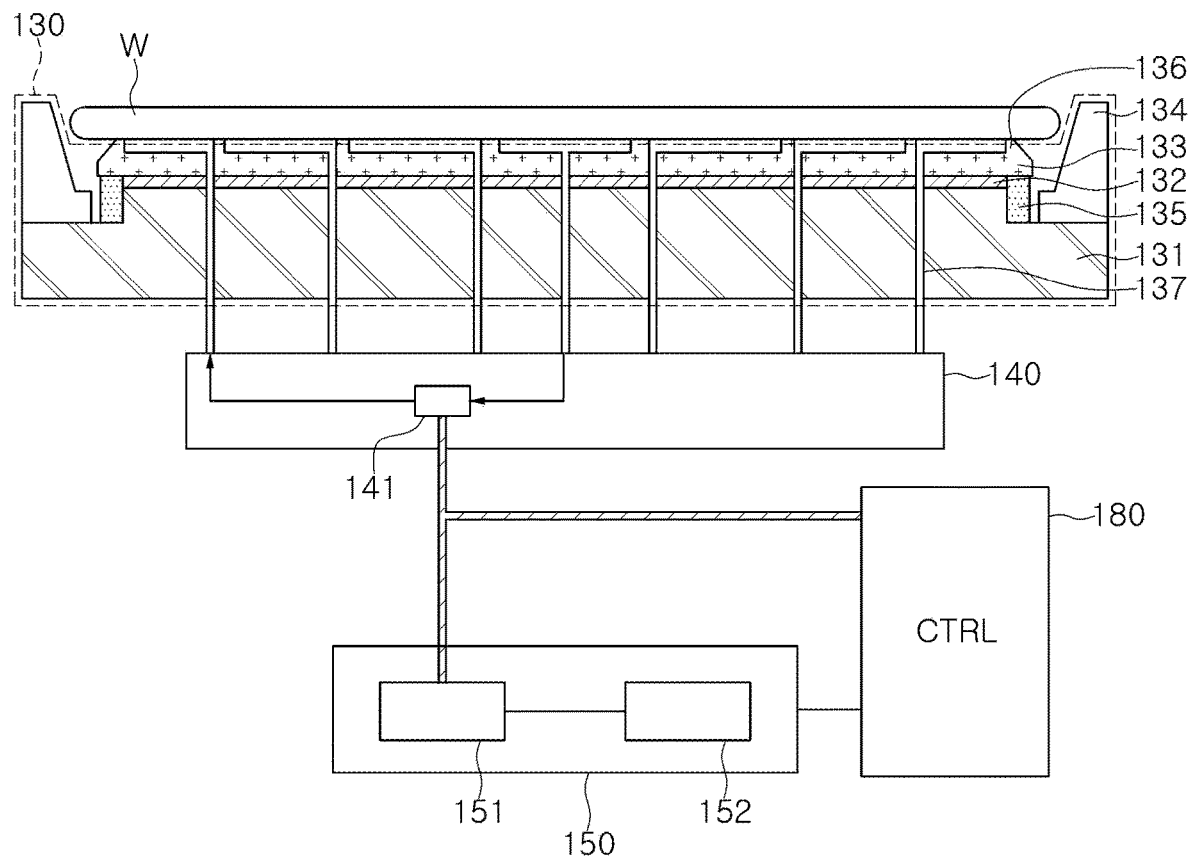
FIGS. 9 and 10 are views illustrating operations of an apparatus for plasma etching, according to an example embodiment of the present inventive concept.
Figure 10:
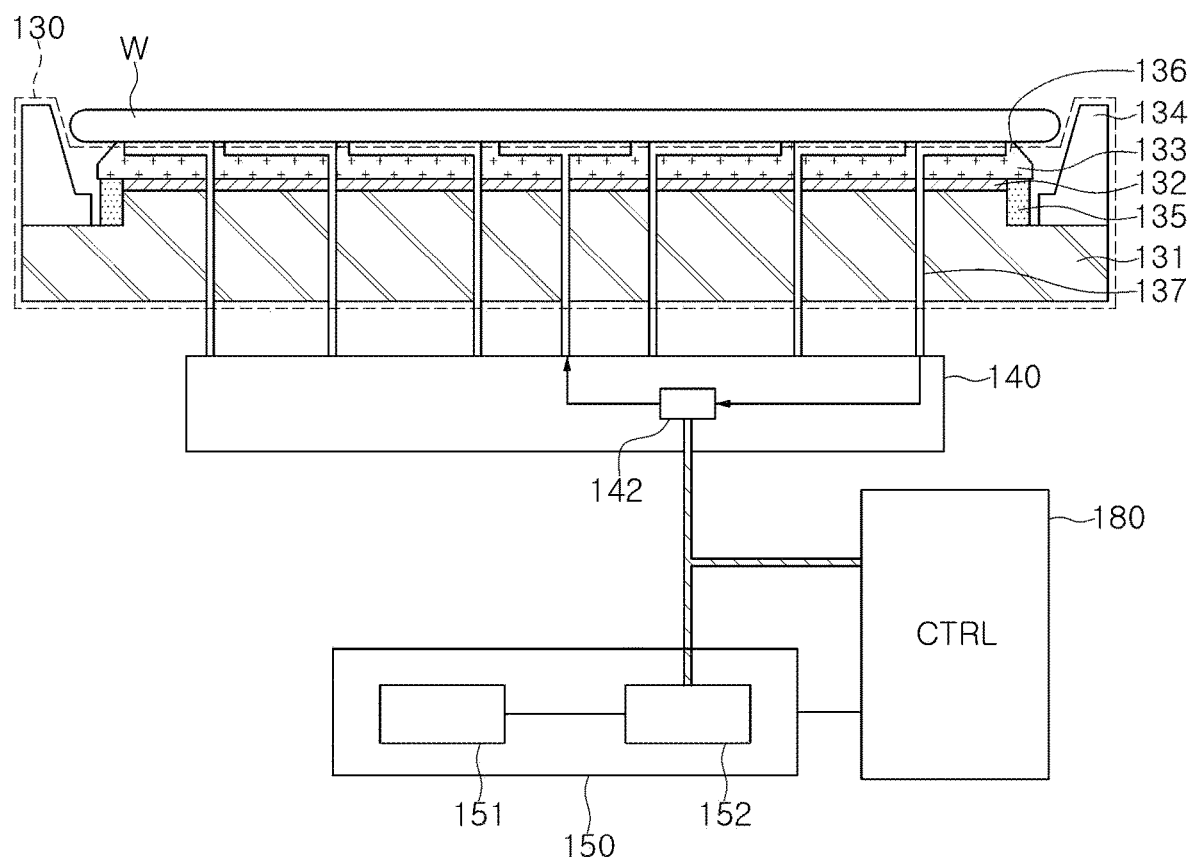

FIG. 8 is a view illustrating operations of an apparatus for plasma etching, according to an example embodiment of the present inventive concept. FIGS. 9 and 10 are views illustrating operations of an apparatus for plasma etching, according to an example embodiment of the present inventive concept.

Referring to FIG. 8, in a plasma etching process performed using an apparatus for plasma etching 100, a coolant injected into an electrostatic chuck 130 may circulate in a first direction or a second direction. For example, a controller 180 may change a circulation direction of the coolant, when the plasma etching process is changed from a main etching operation to an over etching operation.

The apparatus 100 according to an embodiment of the present inventive concept may perform the main etching operation and the over etching operation, with different process temperatures. For example, the main etching operation may be performed at a first temperature, and the over etching operation may be performed at a second temperature.

For example, a coolant causing an electrostatic chuck 130 to reach a first temperature may be injected into the electrostatic chuck 130 in the main etching operation, and a coolant causing the electrostatic chuck to reach a second temperature may be injected into the electrostatic chuck 130 in the over etching operation. The coolant injected in the main etching operation may circulate in the first direction, and the coolant injected in the over etching operation may circulate in the second direction. The first direction may be a direction from an edge of a substrate W to a center of the substrate W. The second direction may be opposite to the first direction, and, for example, may be a direction from the center of the substrate W to the edge of the substrate W.

A path through which the coolant causing the electrostatic chuck 130 to reach the first temperature is injected into the electrostatic chuck 130 may be different from a path through which the coolant causing the electrostatic chuck 130 to reach the second temperature is injected into the electrostatic chuck 130. A plurality of pipes 140 included in the apparatus 100 according to an embodiment of the present inventive concept may include pipes disposed on the path through which the coolant causing the electrostatic chuck 130 to reach the first temperature is injected, and pipes disposed on the path through which the coolant causing the electrostatic chuck 130 to reach the second temperature is injected. For example, in the plasma etching process, pipes through which a coolant passes may be determined by the circulation direction of the coolant.

In the apparatus 100 according to an embodiment of the present inventive concept, the plurality of pipes 140 may include 3-way valves 141 and 142. For example, a first 3-way valve 141 may be a valve for circulating the coolant causing the electrostatic chuck 130 to reach the first temperature in the first direction. A second 3-way valve 142 may be a valve for circulating the coolant causing the electrostatic chuck 130 to reach the second temperature in the second direction.

Referring to FIG. 9, in a main etching operation, a controller 180 may inject a coolant stored in a first storage device 151 into an electrostatic chuck 130 through a plurality of coolant suppliers 137. For example, a second 3-way valve 142 may be closed and a first 3-way valve 141 may be opened. In some embodiments, the controller 180 may cause the second 3-way valve 142 to be closed and the first 3-way valve 141 to be opened. The controller 180 may control the first and second 3-way valves 141 and 142 to change a circulation direction of the coolant. This is only illustrative, and embodiments are not limited thereto. For example, the controller 180 may control the first 3-way valve 141 and the second 3-way valve 142, as necessary.

An etching process may be performed on a molded layer formed in a substrate W at a first temperature. For example, an etching process performed on the molded layer may be a main etching operation. After the main etching operation is completed, an etching process may be performed on a lower substrate disposed below the molded layer. For example, the etching process performed on the lower substrate may be an over etching operation.

Referring to FIG. 10, in an over etching operation, a controller 180 may inject a coolant stored in a second storage device 152 into an electrostatic chuck 130 through a plurality of coolant suppliers 137. For example, a first 3-way valve 141 may be closed and a second 3-way valve 142 may be opened. In some embodiments, the controller 180 may cause the first 3-way valve 141 to be closed and the second 3-way valve 142 to be opened. The controller 180 may control the first and second 3-way valves 141 and 142 to change a circulation direction of the coolant This is only illustrative, and embodiments are not limited thereto.

Figure 11:
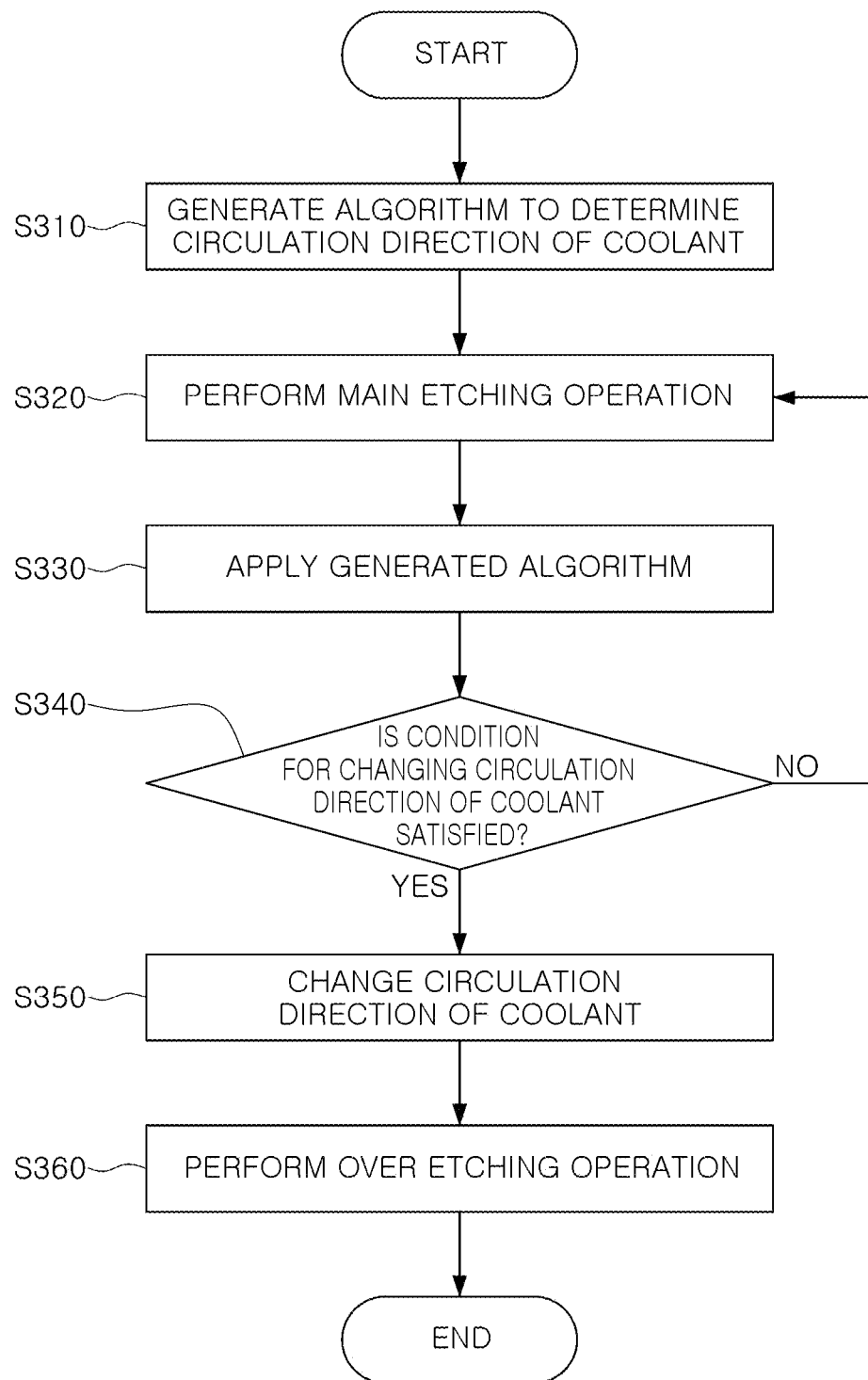
FIG. 11 is a flowchart illustrating operations of an apparatus for plasma etching, according to an example embodiment of the present inventive concept.

FIG. 11 is a flowchart illustrating operations of an apparatus for plasma etching, according to an example embodiment of the present inventive concept.

Referring to FIG. 11, a circulation direction of a coolant in an apparatus for plasma etching according to an embodiment of the present inventive concept may be switched according to various conditions. For example, a controller may generate an algorithm, based on various conditions, to determine the circulation direction of the coolant (S310), and apply the algorithm to the apparatus for plasma etching to control a process temperature of a substrate to be subjected to a plasma etching process. For example, the algorithm may serve to determine the circulation direction of the coolant, based on at least one of sensor values, such as, for example, a process operation, a process parameter, and a process result.

The apparatus according to an embodiment of the present inventive concept may perform a main etching operation for etching a molded layer stacked on an upper surface of a semiconductor substrate (S320). The controller may apply the generated algorithm in the main etching operation (S330). Next, the controller may determine if a condition for changing circulation direction of coolant is satisfied (S340). For example, the algorithm may determine that a condition for changing the circulation direction of the coolant is satisfied when the main etching operation is completed.

Therefore, when a condition for changing the circulation direction of the coolant is not satisfied (S340, NO), the apparatus may continue to perform the main etching operation in S320. When a condition for changing the circulation direction of the coolant is satisfied (S340, YES), the controller may change the circulation direction of the coolant (S350), and may perform an over etching operation to form a recess in the substrate (S360).

Figure 12:
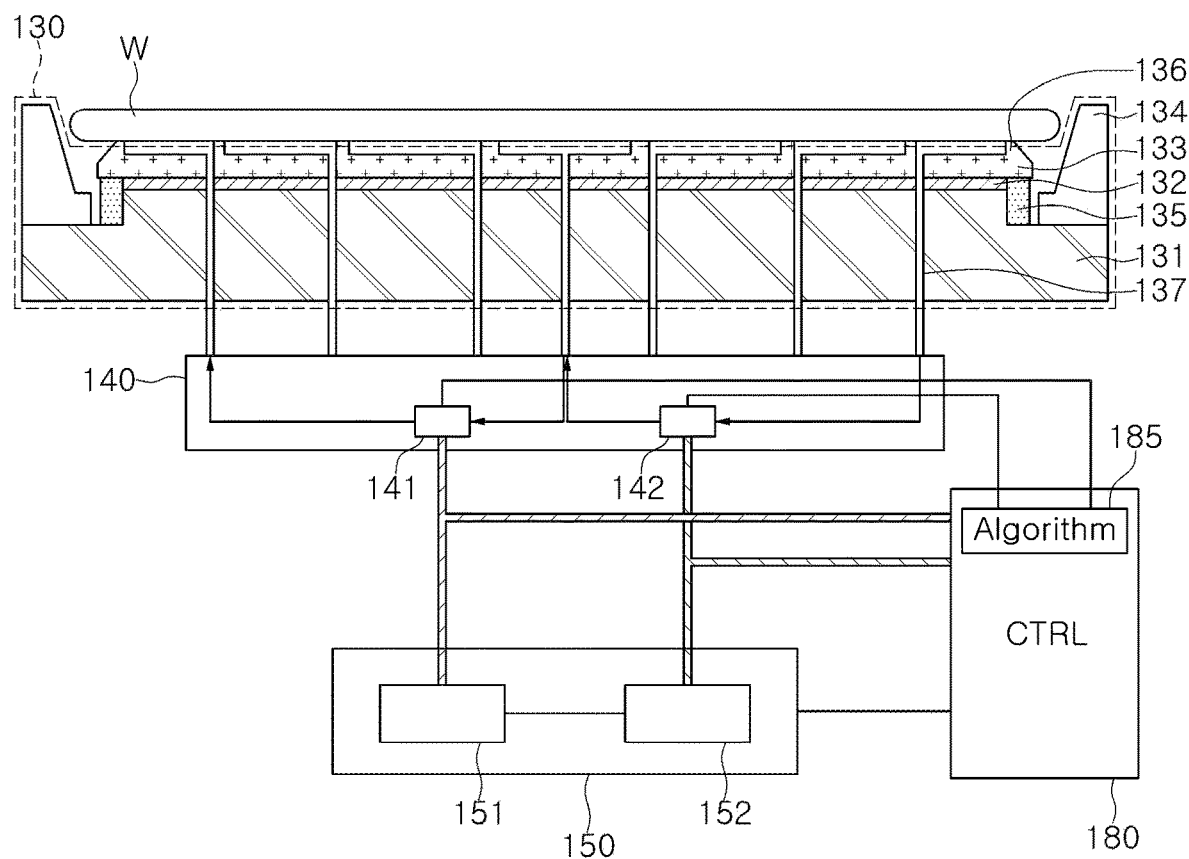
FIG. 12 is a view illustrating a method of controlling operations of an apparatus for plasma etching, according to an example embodiment of the present inventive concept.

FIG. 12 is a view illustrating a method of controlling operations of an apparatus for plasma etching, according to an example embodiment of the present inventive concept.

Referring to FIG. 12 together with FIG. 11, in an apparatus for plasma etching 100 according to an embodiment of the present inventive concept, an algorithm 185 stored in a controller 180 may determine an opening/closing operation of a first 3-way valve 141 and an opening/closing operation of a second 3-way valve 142, connected to a plurality of pipes 140.

The algorithm 185 may determine a circulation direction of a coolant based on a process operation. For example, in the apparatus 100 according to an embodiment of the present inventive concept, the algorithm 185 may be configured to circulate the coolant in a first direction in a main etching operation, and change the circulation direction of the coolant from the first direction to a second direction, when the main etching operation is changed to an over etching operation. This is only illustrative, and embodiments are not limited thereto.

The algorithm 185 may determine the circulation direction of the coolant, based on a process parameter. For example, the process parameter may include at least one of a predetermined process period of time, a predetermined cycle of changing a circulation direction, or a critical dimension of an etched lower hole.

In an embodiment, the algorithm 185 may be configured to circulate the coolant in the first direction during a first period of time of the plasma etching process and circulate the coolant in the second direction during a second period of time of the plasma etching process. For example, the first period of time may be a period of time during which the main etching operation is performed, and the second period of time may be a period of time during which the over etching operation is performed. This is only illustrative, and embodiments are not limited thereto. The algorithm 185 may be configured to reverse the circulation direction every predetermined cycle.

The algorithm 185 may determine the circulation direction of the coolant, based on a sensor value, such as a process result or the like. For example, a sensor value, such as a process result or the like, may be an output signal of a sensor included in the electrostatic chuck 130, and the output signal of the sensor may include temperature distribution of the electrostatic chuck 130, pressure distribution of a coolant, or the like.

This is only illustrative, and a condition considered in case of configuring the algorithm 185 is not limited thereto. For example, the algorithm 185 may be configured to switch the circulation direction of the coolant by comprehensively considering the plurality of conditions described above.

Figure 13:
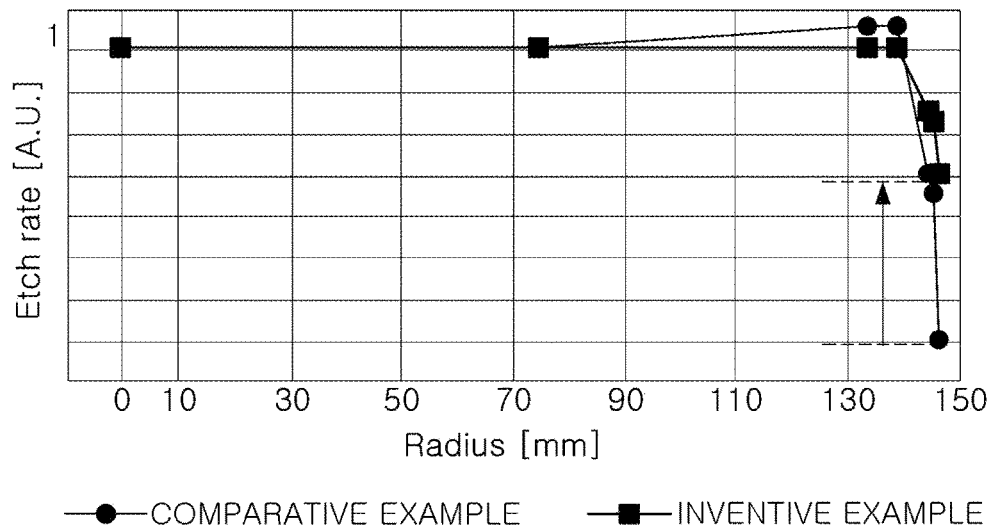
FIG. 13 is a view illustrating an effect of an apparatus for plasma etching, according to an example embodiment of the present inventive concept.

FIG. 13 is a view illustrating an effect of an apparatus for plasma etching, according to an example embodiment of the present inventive concept.

Referring to FIG. 13, in an etching process performed in a general apparatus for plasma etching, a difference in etching rate may appear between a center of a substrate and an edge of the substrate due to an imbalance in temperature distribution of the substrate. For example, the etching rate may be defined as a ratio of an etch thickness to an etch period of time. Since an apparatus for plasma etching according to an embodiment of the present inventive concept may apply two process temperatures in a plasma etching process, a balance in temperature distribution of the substrate may be more important.

In an apparatus for plasma etching according to an embodiment of the present inventive concept, temperature distribution of the substrate may be balanced by changing a circulation direction of a coolant according to a process operation. A structure of an electrostatic chuck included in the apparatus for plasma etching may be optimized to further reduce a difference in etching rate between the center of the substrate and the edge of the substrate.

An apparatus for plasma etching according to an embodiment of the present inventive concept may switch the circulation direction of the coolant and may optimize the structure of the electrostatic chuck, to reduce a difference in etching rate between the center of the substrate and the edge of the substrate, to less than half of the conventional etching rate. For example, a decrease in etching rate in an outside of a diameter of 130 mm in the substrate may be prevented to reduce a decrease in etching rate of the edge of the substrate relative to the center of the substrate, to about 6%. This is only illustrative, and embodiments are not limited thereto.

Figure 14:
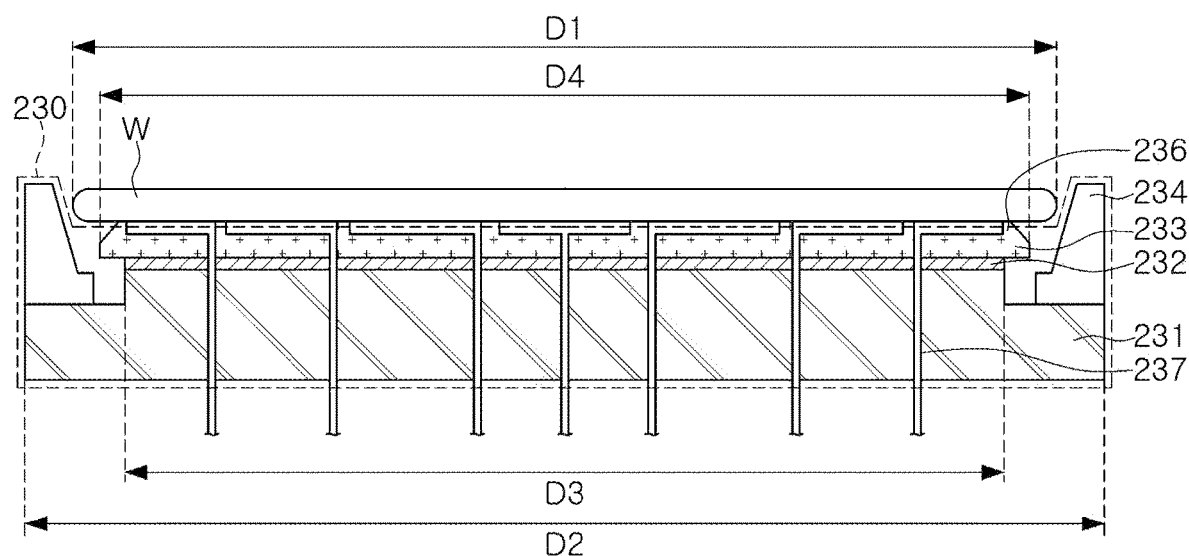
FIG. 14 is a view illustrating a structure of an electrostatic chuck in an apparatus for plasma etching, according to an example embodiment of the present inventive concept.

FIG. 14 is a view illustrating a structure of an electrostatic chuck in an apparatus for plasma etching, according to an example embodiment of the present inventive concept.

Referring to FIG. 14, an apparatus for plasma etching according to an embodiment of the present inventive concept may correspond to the apparatus 100 illustrated in FIG. 6. In an embodiment, an electrostatic chuck 230 may not include a heat transfer block. This is only illustrative, and embodiments are not limited thereto. For example, the electrostatic chuck 230 may further include a component corresponding to the heat transfer block 135 illustrated in FIG. 6. The heat transfer block may provide an additional cooling effect to an edge region of a substrate W or may prevent heat loss, to further improve cooling efficiency.

The electrostatic chuck 230 may include a base layer 231, a bonding layer 232, and an adsorption layer 233 on which the substrate W is disposed. The base layer 231, the bonding layer 232, and the adsorption layer 233 of FIG. 14 may correspond to the base layer 131, the bonding layer 132, and the adsorption layer 133, respectively, of FIG. 6. For example, the substrate W may have a first diameter D1. The base layer 231 may have a first region having a second diameter D2, greater than the first diameter D1 of the substrate W, and a second region having a third diameter D3, less than the first diameter D1 of the substrate W. The bonding layer 232 connecting the base layer 231 and the adsorption layer 233 may have the third diameter D3, and the adsorption layer 233 may have a fourth diameter D4, less than the first diameter D1 and equal to or greater than the third diameter D3. This is only illustrative, and a structure of the electrostatic chuck 230 is not limited thereto.

In an apparatus for plasma etching according to an embodiment of the present inventive concept, the fourth diameter D4, a diameter of the adsorption layer 233, may have a value of 296 mm or more, for example, between about 297 mm and 299 mm. For example, the fourth diameter D4 may be about 298 mm. Compared to a general apparatus for plasma etching, the fourth diameter D4 may have a value, closer to the first diameter D1 of the substrate W. Therefore, an apparatus for plasma etching according to an embodiment of the present inventive concept may prevent a decrease in etching rate in an edge region of the substrate W.

The electrostatic chuck 230 may further include an edge ring 234, a plurality of protrusions 236, and a plurality of coolant suppliers 237. The edge ring 234, the plurality of protrusions 236, and the plurality of coolant suppliers 237 of FIG. 14 may correspond to the edge ring 134, the plurality of protrusions 136, and the plurality of coolant suppliers 137, respectively, of FIG. 6.

Figure 15:
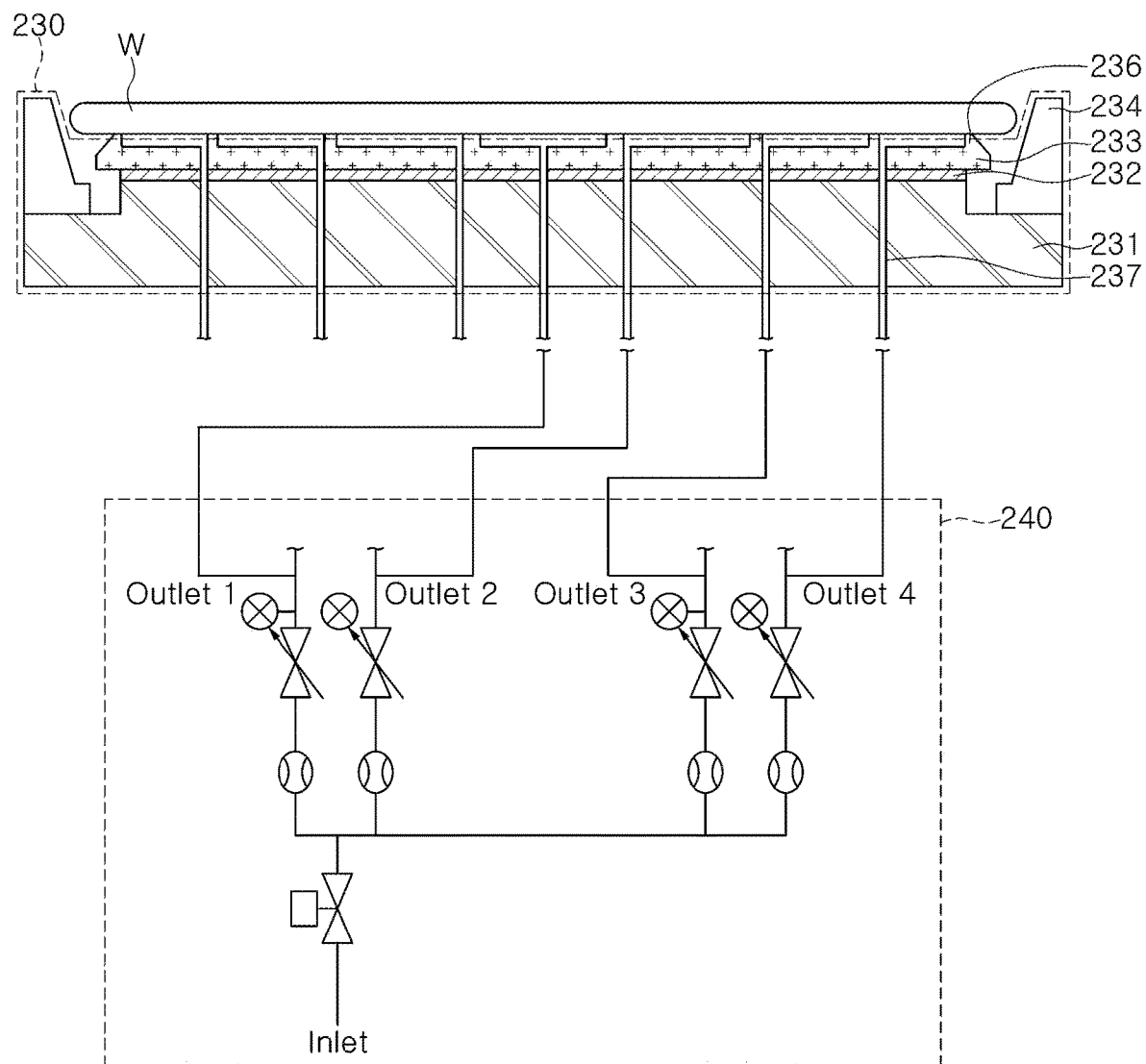
FIG. 15 is a side view illustrating a structure of an electrostatic chuck in an apparatus for plasma etching, according to an example embodiment of the present inventive concept.
Figure 16:
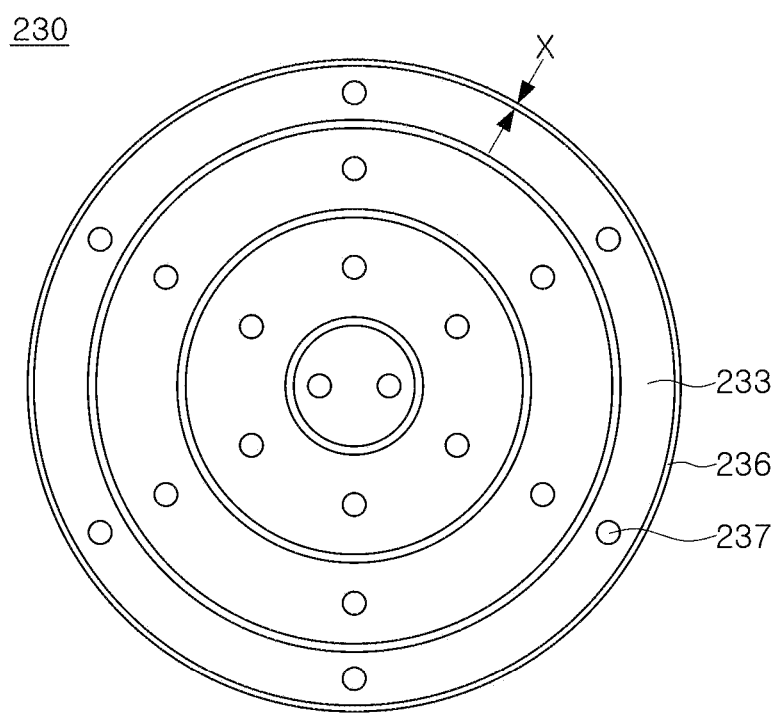
FIG. 16 is a top view illustrating a structure of an electrostatic chuck in an apparatus for plasma etching, according to an example embodiment of the present inventive concept.

FIG. 15 is a side view illustrating a structure of an electrostatic chuck in an apparatus for plasma etching, according to an example embodiment of the present inventive concept. FIG. 16 is a top view illustrating a structure of an electrostatic chuck in an apparatus for plasma etching, according to an example embodiment of the present inventive concept.

Referring to FIGS. 15 and 16, an electrostatic chuck 230 of an apparatus for plasma etching according to an embodiment of the present inventive concept may include an adsorption layer 233 contacting a substrate W to be subjected to an etching process, and the adsorption layer 233 may include a plurality of protrusions 236 contacting a lower surface of the substrate W.

For example, each of the plurality of protrusions 236 may have a donut shape having the same center and a different radius, compared to those of the adsorption layer 233. For example, the plurality of protrusions 236 may be arranged concentrically on the adsorption layer 233. The adsorption layer 233 may be divided into a plurality of regions by the plurality of protrusions 236 as boundaries, and a coolant for controlling a temperature of the substrate W during a plasma etching process may be injected into the plurality of regions. For example, the centermost one of the plurality of regions may be within the innermost one of the plurality of protrusions 236, and the others of the plurality of regions may be between adjacent ones of the plurality of protrusions 236.

An apparatus for plasma etching according to an embodiment of the present inventive concept may include an electrostatic chuck 230 having a plurality of regions, e.g., four regions, and the electrostatic chuck 230 may have a 4-zone He structure for selectively injecting a coolant into each of the plurality of regions. For example, referring to FIG. 15, the electrostatic chuck 230 may selectively inject the coolant using a plurality of pipes 240 including a plurality of valves Inlet, Outlet 1, Outlet 2, Outlet 3, and Outlet 4 and a plurality of flow meters, corresponding to each of the plurality of regions. This is only illustrative, and embodiments are not limited thereto. For example, the plurality of regions formed in the electrostatic chuck 230 may include 1 to 4 regions. In some embodiments, the plurality of pipes 240 may correspond to the plurality of pipes 140, and one or more of the plurality of valves Inlet, Outlet 1, Outlet 2, Outlet 3, and Outlet 4 may correspond to the first and second 3-way valves 141 and 142.

Each of the plurality of regions formed on the electrostatic chuck 230 may have different widths in a radial direction. For example, a width of a region formed in a central portion of the electrostatic chuck 230 may be greater than a width of a region formed in an outermost portion of the electrostatic chuck 230. For example, a width between adjacent ones of the plurality of protrusions 236 at the central portion of the electrostatic chuck 230 may be greater than a width between adjacent ones of the plurality of protrusions 236 at an outer portion of the electrostatic chuck 230. Therefore, an apparatus for plasma etching according to an embodiment of the present inventive concept may improve cooling efficiency at an edge of the substrate W, in which a heat problem may be generated.

In order to improve the cooling efficiency, the plurality of protrusions 236 may be formed such that contact between each of the plurality of protrusions 236 and the lower surface of the substrate W is kept to a minimum. For example, the plurality of protrusions 236 may be formed to have widths that minimize contact with the substrate W. Widths of the plurality of protrusions 236 that are in contact with the lower surface of the substrate W may be different to each other. In embodiments, the width of each of the plurality of protrusions 236 may be defined as the width at the point of contact with the substrate W.

The plurality of protrusions 236 may have a structure capable of maintaining the coolant injected between the plurality of protrusions 236 at a predetermined pressure or higher. For example, during the plasma etching process, the coolant may maintain a pressure of about 50 mTorr or higher, for example, between about 50 mTorr and 500 mTorr, near a protrusion disposed in the outermost portion of the electrostatic chuck 230. For example, widths of the protrusions 236 may be determined in consideration of leakage and cooling capability of the coolant.

In an apparatus for plasma etching according to an embodiment of the present inventive concept, a width X of a protrusion disposed in an outermost portion of the adsorption layer 233 contacting the lower surface of the substrate W may be less than a width of other respective protrusions. For example, the width X of the protrusion disposed in the outermost portion, among the plurality of protrusions 236, may have a value between about 1.5 mm and 4 mm. For example, the width X of the protrusion disposed in the outermost portion may be 2 mm. Therefore, the coolant supplied between the plurality of protrusions 236 may evenly control temperature distribution with respect to a total area of the substrate W.

Referring to FIG. 16, an electrostatic chuck 230 of an apparatus for plasma etching according to an embodiment of the present inventive concept may include a plurality of coolant suppliers 237 respectively connected to a plurality of regions. For example, each of the plurality of regions may include one or more of the plurality of coolant suppliers 237. The number and arrangement of the plurality of coolant suppliers 237 respectively connected to the plurality of regions are not limited to those illustrated.

Figure 17:
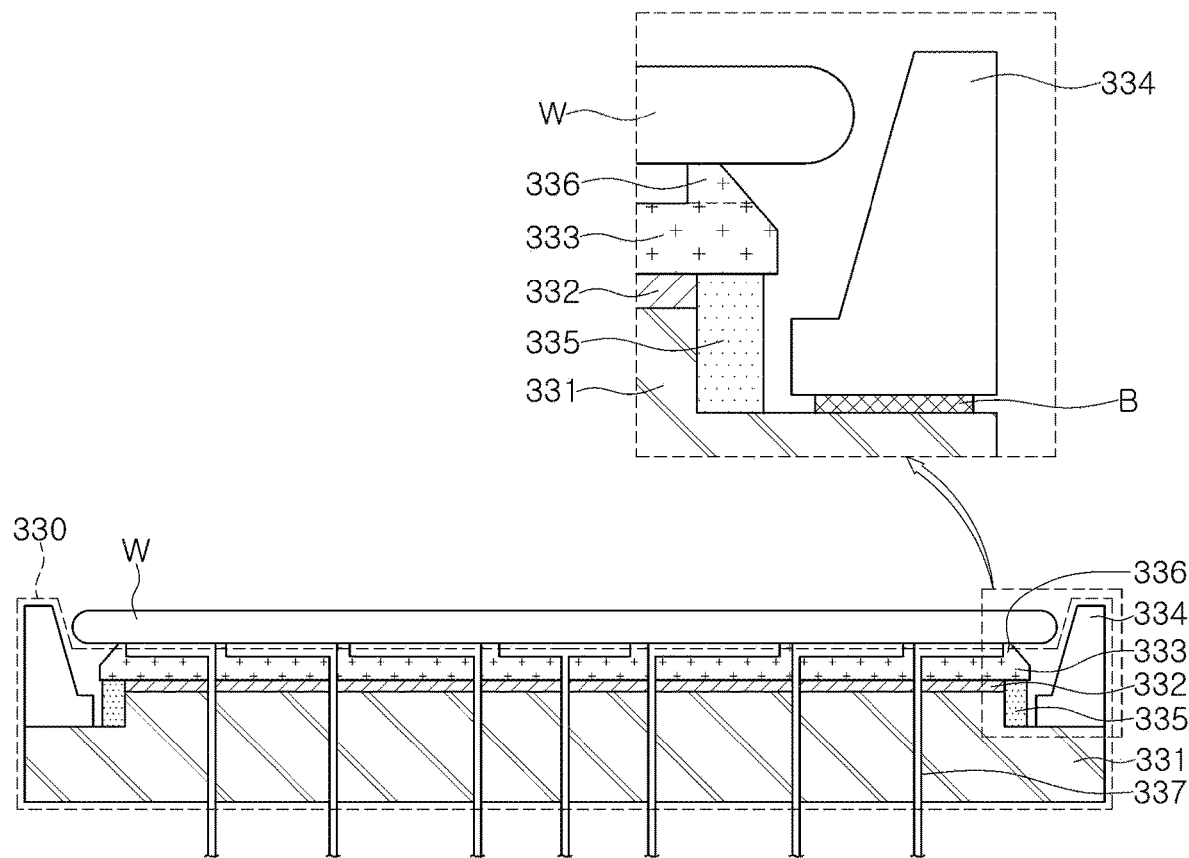
FIG. 17 is a view illustrating a structure of an electrostatic chuck in an apparatus for plasma etching, according to an example embodiment of the present inventive concept.

FIG. 17 is a view illustrating a structure of an electrostatic chuck in an apparatus for plasma etching according to an embodiment of the present inventive concept.

Referring to FIG. 17, an apparatus for plasma etching according to an embodiment of the present inventive concept may include components corresponding to the components included in the apparatus 100 illustrated in FIG. 6. For example, the apparatus for plasma etching of FIG. 17 may include an electrostatic chuck 330, a base layer 331, a bonding layer 332, an adsorption layer 333, an edge ring 334, a heat transfer block 335, a plurality of protrusions 336, and a plurality of coolant suppliers 337, which correspond to the electrostatic chuck 130, the base layer 131, the bonding layer 132, the adsorption layer 133, the edge ring 134, the heat transfer block 135, the plurality of protrusions 136, and the plurality of coolant suppliers 137, respectively, of FIG. 6.

The electrostatic chuck 330 may be disposed in the chamber 110 in which a plasma etching process is performed. The electrostatic chuck 330 may include the base layer 331, the bonding layer 332, and the adsorption layer 133, which are sequentially stacked. The bonding layer 332 may couple the base layer 331 and the adsorption layer 333 to each other.

For example, the electrostatic chuck 330 may further include the heat transfer block 335 disposed between a first region of the base layer 331 and the adsorption layer 333 and on a lateral surface of a second region of the base layer 331. Also, the electrostatic chuck 330 may include the edge ring 334 disposed on the first region of the base layer 331, spaced apart from a lateral surface of a substrate W, and surround the lateral surface of the substrate W.

In an apparatus for plasma etching according to an embodiment of the present inventive concept, the edge ring 334 and the base layer 331 may be connected through a ring bonding layer B. For example, the edge ring 334 may be configured to improve cooling efficiency in an edge portion of the substrate W. The ring bonding layer B may be made of the same or similar material as the base layer 331. For example, the ring bonding layer B may be made of aluminum (Al).

Since the ring bonding layer B is made of the same aluminum (Al) as the base layer 331, a difference in temperature between the base layer 331 and the edge ring 334 may be reduced, when the substrate W is cooled. Therefore, temperature distribution of the substrate W may be evenly adjusted.

An apparatus for plasma etching according to an embodiment of the present inventive concept may selectively apply a low temperature process and a high temperature process according to an etching operation, to maintain a high etching rate and improve selectivity for a lower substrate.

An apparatus for plasma etching according to an embodiment of the present inventive concept may change a circulation direction of a coolant to efficiently control a process temperature.

An apparatus for plasma etching according to an embodiment of the present inventive concept may optimize a structure of an electrostatic chuck to reduce a difference in etching rate, depending on a position of a substrate, which may be intensified when a process temperature is changed according to a process operation.

Various advantages and effects of the present inventive concept are not limited to the above, and can be more easily understood in the process of describing specific embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. An apparatus for plasma etching comprising: an electrostatic chuck disposed in a chamber in which a plasma etching process is performed, and including a base layer, a bonding layer disposed on the base layer, and an adsorption layer including a plurality of protrusions, the adsorption layer disposed on the bonding layer and contacting a lower surface of a substrate to be subjected to the plasma etching process; a plurality of pipes configured to supply coolant to the base layer to adjust a temperature of the electrostatic chuck; a cooling device configured to supply the coolant to cause the electrostatic chuck to reach a first temperature between about −40° C. and −5° C. during a first operation of the plasma etching process, and configured to supply the coolant to cause the electrostatic chuck to reach a second temperature between about 30° C. and 90° C. during a second operation of the plasma etching process after the first operation; and a controller configured to control a valve connected to the plurality of pipes to control a circulation of the coolant, wherein the base layer includes a first region having a second diameter greater than a first diameter of the substrate, and a second region having a third diameter smaller than the first diameter, wherein the diameter of the bonding layer is equal to the third diameter, and wherein the adsorption layer has a fourth diameter smaller than the first diameter and equal to or greater than the third diameter.

2. The apparatus of claim 1,
wherein the substrate comprises a lower substrate and a molded layer stacked on an upper surface of the lower substrate, and
wherein the first operation is a main etching operation in which etching of the molded layer is performed, and the second operation is an over etching operation of forming a recess in the lower substrate.

3. The apparatus of claim 1, wherein a direction of the circulation of the coolant during the first operation is different from a direction of the circulation of the coolant during the second operation.

4. The apparatus of claim 1,
wherein the controller determines a direction of the circulation of the coolant during the first operation, based on a process parameter of the plasma etching process, and
wherein the process parameter comprises at least one of a predetermined process period of time, a predetermined cycle of changing a circulation direction, or a critical dimension of an etched lower hole.

5. The apparatus of claim 1,
wherein the controller determines a direction of the circulation of the coolant during the first operation, based on a sensor value included in the electrostatic chuck, and
wherein the sensor value comprises at least one of a temperature distribution of the electrostatic chuck or a pressure distribution of the coolant.

6. The apparatus of claim 1, wherein a pipe, through which the coolant passes among the plurality of pipes, is determined by a direction of the circulation of the coolant.

7. The apparatus of claim 1, further comprising:
an edge ring disposed on the base layer to be spaced apart from a lateral surface of the substrate and to surround the lateral surface of the substrate; and
a ring bonding layer disposed between the edge ring and the base layer.

8. The apparatus of claim 7, wherein the ring bonding layer is formed of the same material as the base layer.

9. The apparatus of claim 7, wherein the ring bonding layer is formed of aluminum (Al).

10. The apparatus of claim 1, wherein the electrostatic chuck further comprises a heat transfer block disposed on a lateral surface of the second region of the base layer between the first region of the base layer and the adsorption layer.

11. The apparatus of claim 1,
wherein a diameter of the adsorption layer has a value between about 297 mm and 299 mm, and
wherein a width of an outermost protrusion among the plurality of protrusions has a value between about 1.5 mm to 4 mm.

* * * * *